(12) United States Patent
Choi et al.

(10) Patent No.: US 8,148,710 B2
(45) Date of Patent: Apr. 3, 2012

(54) PHASE-CHANGE MEMORY DEVICE USING A VARIABLE RESISTANCE STRUCTURE

(75) Inventors: Suk-Hun Choi, Gyeonggi-do (KR); Chang-Ki Hong, Gyeonggi-do (KR); Yoon-Ho Son, Gyeonggi-do (KR); Jang-Eun Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/805,824

(22) Filed: Aug. 20, 2010

(65) Prior Publication Data

US 2010/0320434 A1 Dec. 23, 2010

Related U.S. Application Data

(62) Division of application No. 12/654,714, filed on Dec. 30, 2009, now Pat. No. 7,803,657, which is a division of application No. 11/428,925, filed on Jul. 6, 2006, now Pat. No. 7,666,789.

(30) Foreign Application Priority Data

Jul. 25, 2005 (KR) .................... 2005-67366

(51) Int. Cl.
*H01L 47/00* (2006.01)
*H01L 29/08* (2006.01)
*H01L 29/18* (2006.01)

(52) U.S. Cl. ............... 257/4; 257/42; 257/E31.029

(58) Field of Classification Search .............. 257/42, 257/E31.029, 4
See application file for complete search history.

(56) References Cited

U.S. PATENT DOCUMENTS

| | | | |
|---|---|---|---|
| 6,706,554 B2 | 3/2004 | Ogura | |
| 6,797,612 B2 | 9/2004 | Zahorik | |
| 2002/0025372 A1 | 2/2002 | Leiphart | |
| 2004/0048460 A1 | 3/2004 | Asahina et al. | |
| 2004/0238957 A1 | 12/2004 | Akram et al. | |
| 2005/0130414 A1 | 6/2005 | Choi et al. | |
| 2006/0030108 A1* | 2/2006 | Cho et al. ............. | 438/281 |
| 2008/0280411 A1 | 11/2008 | Chang | |

FOREIGN PATENT DOCUMENTS

| | | |
|---|---|---|
| KR | 2003-0086820 | 11/2003 |
| KR | 2005-0001169 | 1/2005 |
| KR | 2005-0031160 | 4/2005 |
| KR | 2005-0033340 | 4/2005 |
| KR | 2005-0071965 | 7/2005 |

\* cited by examiner

*Primary Examiner* — Matthew Landau
*Assistant Examiner* — Daniel Luke
(74) *Attorney, Agent, or Firm* — Harness, Dickey & Pierce, P.L.C.

(57) ABSTRACT

A phase-change memory device including a first contact region and a second contact region formed on a semiconductor substrate. A first insulating layer with a first contact hole and a second contact hole is disposed on the semiconductor substrate, exposing the first and second contact regions. A first conductive layer is disposed on the first insulating interlayer to fill the first and the second contact holes. A first protection layer pattern and a lower wiring protection pattern are disposed on the first conductive layer. A first contact with a first electrode and a second contact with a lower wiring are disposed so as to connect the first and second contact regions. A second protection layer with a second electrode is disposed on the first protection layer pattern and the lower wiring protection pattern. A via filled with a phase-change material is disposed between the first electrode and the second electrode.

11 Claims, 25 Drawing Sheets

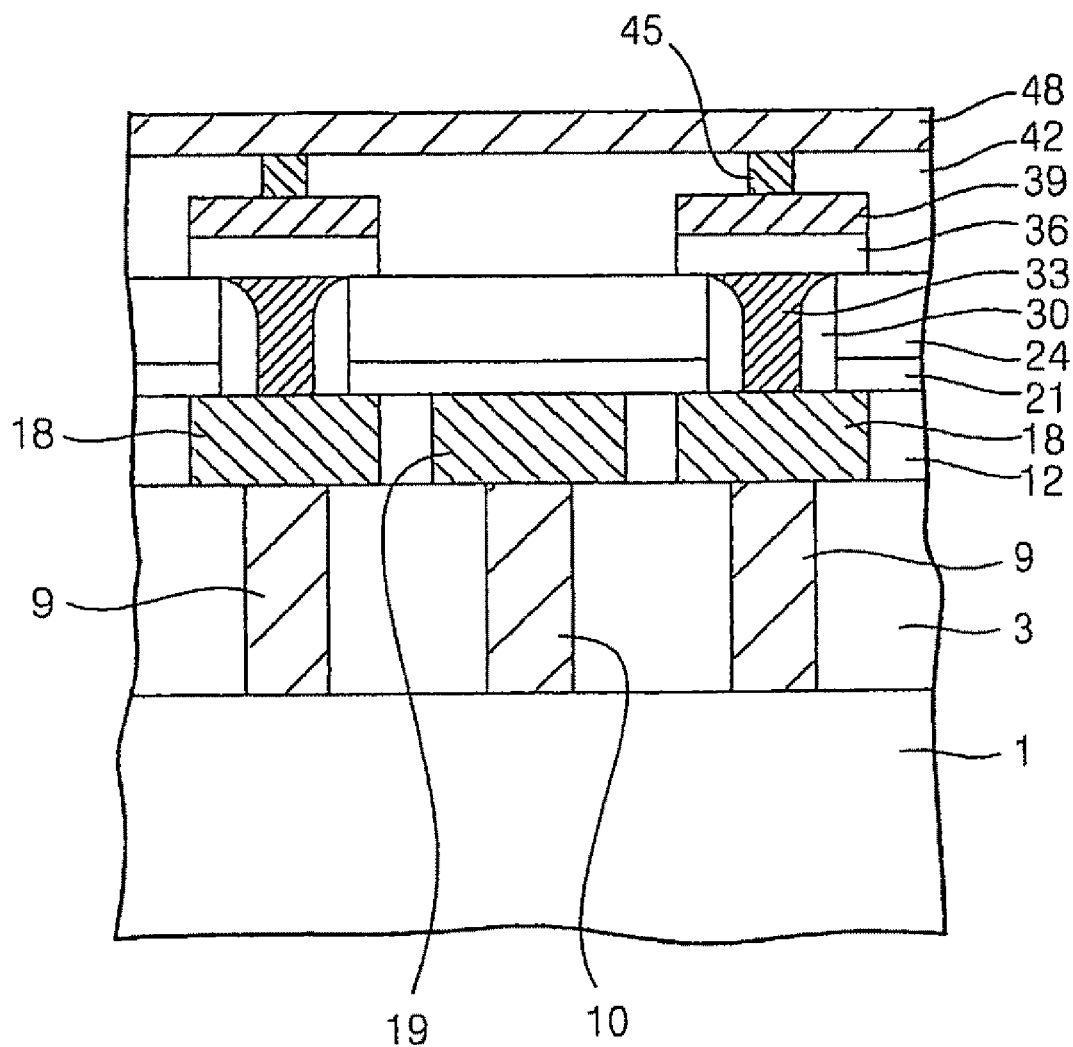

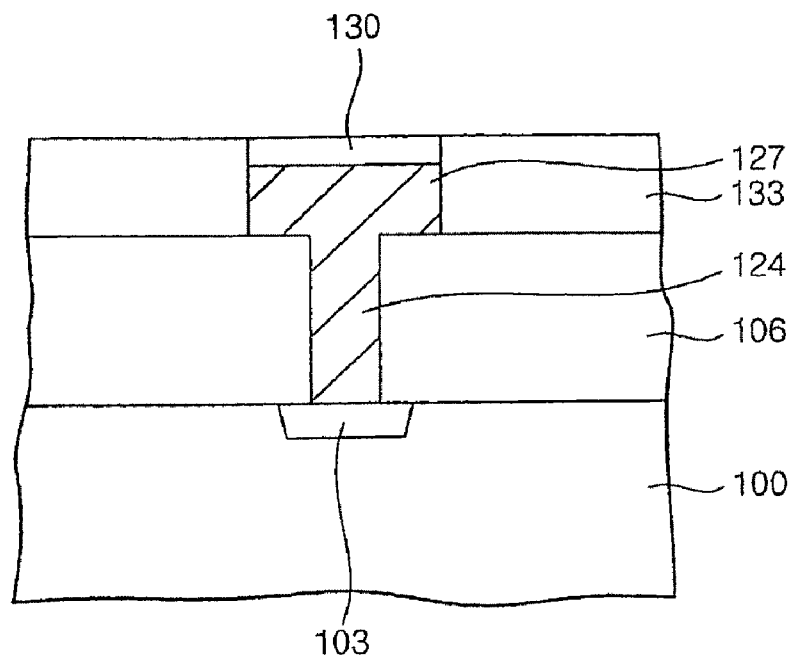
FIG. 5D
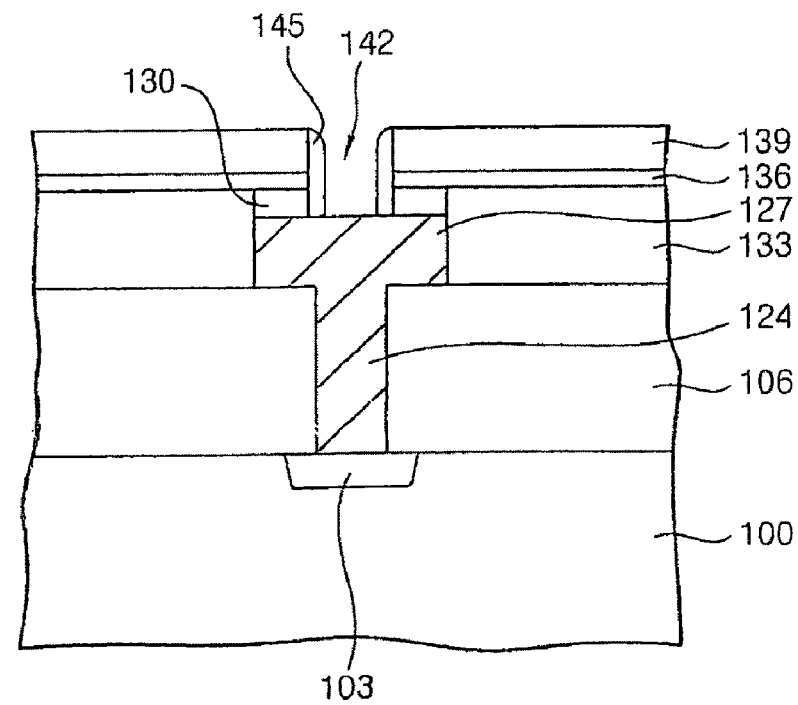

PHASE-CHANGE MEMORY DEVICE USING A VARIABLE RESISTANCE STRUCTURE

CROSS-REFERENCE TO RELATED APPLICATIONS

This application is a divisional of application Ser. No. 12/654,714 filed Dec. 30, 2009 now U.S. Pat. No. 7,803,657 which is a divisional of application Ser. No. 11/428,925 filed Jul. 6, 2006 now U.S. Pat. No. 7,666,789, which claims the benefit under 35 U.S.C. §119(a) of Korean Patent Application No. 2005-0067366 filed on Jul. 25, 2006, the contents of each are herein incorporated by reference in their entirety.

BACKGROUND

1. Field of the Invention

Example embodiments of the present invention relate to a method of manufacturing a variable resistance structure and a method of manufacturing a phase-change memory device using the same. More particularly, example embodiments of the present invention relate to a method of manufacturing a variable resistance structure having improved electrical characteristics and a method of manufacturing a phase-change memory device using the same.

2. Description of the Related Art

Generally, semiconductor memory devices are classified into volatile semiconductor memory devices, such as dynamic random-access memory (DRAM) devices or static random-access memory (SRAM) devices, and non-volatile semiconductor memory devices, such as flash memory devices or electrically erasable programmable read-only memory (EEPROM) devices, according to whether data stored in the memory devices is erased or not when power is turned off. Non-volatile semiconductor memory devices, for example, flash memory devices, have been widely employed in portable electronic devices, such as digital cameras, cellular phones, MP3 players, etc. However, since the flash memory device requires a relatively long time to write data or to read stored data, new non-volatile semiconductor memory devices, such as ferroelectric random-access memory (FRAM) devices, magnetic random-access memory (MRAM) devices, and phase-change random-access memory (PRAM) devices, have been developed.

Among the non-volatile semiconductor memory devices, a PRAM device may store data by utilizing a resistance difference between an amorphous phase of a chalcogenide compound and a crystalline phase of the chalcogenide compound. That is, the PRAM device may store the data in states of "0" or "1" using a reversible phase transition of the chalcogenide compound, such as germanium-antimony-tellurium (Ge—Sb—Te; GST), in accordance with the length and width of a pulse applied to the PRAM device. In other words, a reset current required to form the amorphous phase having a relatively high resistance, and a set current required to form the crystalline phase having a relatively low resistance may be transmitted from a transistor to the phase-change material layer through a lower electrode having a relatively small size to generate the phase transition of the chalcogenide compound. An upper portion of the lower electrode is connected to the phase-change material layer and a lower portion of the lower electrode is connected to a contact making electrical contact with the transistor. Here, the contact may be an ohmic contact without a resistance defect. Conventional PRAM devices are disclosed in Korean Patent No. 437,458, Korean Laid-Open Patent Publication No. 2005-31160, U.S. Patent Application Publication No. 2004/02348957 and U.S. Pat. No. 6,797,612.

FIGS. 1A to 1E are cross-sectional views illustrating a method of manufacturing a conventional PRAM device.

Referring to FIG. 1A, after a first insulating interlayer 3 of oxide is formed on a semiconductor substrate 1 having contact regions (not shown), the first insulating interlayer 3 is partially etched to form first and second contact holes 6 and 7 that expose the contact regions, respectively.

A first contact 9 and a second contact 10 are formed in the first and the second contact holes 6 and 7. The first and the second contacts 9 and 10 make contact with the contact regions of the semiconductor substrate 1.

Referring to FIG. 1B, after a second insulating interlayer 12 of oxide is formed on the first and the second contacts 9 and 10 and the first insulating interlayer 3, the second insulation interlayer 12 is etched by a photolithography process so that first openings that expose the first and the second contacts 9 and 10 are formed through the second insulation interlayer 12.

A first conductive layer 15 of tungsten is formed on the first and the second contacts 9 and 10 and the second insulating interlayer 12 to fill up the first openings.

Referring to FIG. 1C, the first conductive layer 15 is polished by a chemical mechanical polishing (CMP) process until the second insulating interlayer 12 is exposed, to thereby form a pad 18 and a lower wiring 19. The pad 18 is positioned on the first contact 9 whereas the lower wiring 19 is positioned on the second contact 10.

A nitride layer 21 and an oxide layer 24 are sequentially formed on the second insulating interlayer 12, the pad 18 and the lower wiring 19.

After the oxide layer 24 and the nitride layer 21 are partially etched through a photolithography process to form a second opening 27 exposing the pad 18, a spacer 30 is formed on a sidewall of the second opening 27.

Referring to FIG. 1D, a second conductive layer is formed on the pad 18 and the oxide layer 24 to fill up the opening 27.

The second conductive layer is polished by a CMP process until the oxide layer 24 is exposed, thereby forming a lower electrode 33 filling the second opening 27 on the pad 18. The spacer 30 is positioned between the lower electrode 33 and the sidewall of the second opening 27.

Referring to FIG. 1E, a phase-change material layer pattern 36 and an upper electrode 39 are sequentially formed on the lower electrode 33 and the oxide layer 24.

A third insulating interlayer 42 of oxide is formed on the oxide layer 24 to cover the upper electrode 39.

After an upper contact 45 making contact with the upper electrode 39 is formed through the third insulating interlayer 42, an upper wiring 48 is formed on the upper contact 45 and the third insulating interlayer 42.

In the above-mentioned method of manufacturing the conventional PRAM device, after the first openings are formed through the second insulating interlayer 12 and the first conductive layer 15 is formed on the second insulating interlayer 12 to fill up the first openings, the pad 18 is formed by the CMP process to fill up the first opening. However, a seam or a void may be generated at a central portion of the pad 18 by a growth of tungsten in the processes for forming the first conductive layer 15 and the CMP process.

FIG. 2 is a graph illustrating defects of a metal layer generated in a CMP process. In FIG. 2, "I" indicates corrosion of a metal layer pattern generated in the CMP process, and "II" indicates an over-corrosion of an edge portion of the metal layer pattern in the CMP process.

Referring to FIG. 2, when the metal layer is polished by the CMP process to form the metal layer pattern such as the pad 18, a seam or a void is generated due to the corrosion (I) or the over-corrosion (II) of the metal layer pattern. A size of the seam or the void generated in the metal layer pattern may be greatly increased in a subsequent etching and cleaning processes.

FIGS. 3A to 3C are electron microscopic pictures illustrating a seam generated in a pad of a conventional phase-change memory device. FIG. 4 is an electron microscopic picture illustrating a cross section of the conventional phase-change memory device.

As shown in FIGS. 3A to 3C, although an initial diameter of the seam generated in a pad 18 is about 30 nm, an intermediate diameter of the seam becomes about 42 nm after an etching process. Further, a final diameter of the seam is about 42 nm after a cleaning process. When the seam having an increased size is generated at a central portion of the pad 18, a resistance defect may be generated between the pad 18 and a lower electrode formed on the pad 18. Therefore, electrical characteristics of the PRAM device may be considerably reduced. For example, the number of defects caused by the seam or the void in the pad 18 may make up about 25 to about 80 percent of the total number of defects generated in the PRAM device.

SUMMARY

Embodiments of the present invention provide a method of manufacturing a variable resistance structure including a protective layer that prevents processing damage to metal electrodes during subsequent processing, thereby improving the electrical characteristics of the structure. Other embodiments of the present invention provide a method of manufacturing a phase-change memory device including a variable resistance structure having improved electrical characteristics.

BRIEF DESCRIPTION OF THE DRAWINGS

The above and other features and advantages of the present invention will become more apparent by describing in detail example embodiments thereof with reference to the accompanying drawings.

FIGS. 1A to 1E are cross-sectional views illustrating a method of manufacturing a conventional phase-change memory device.

FIGS. 5A to 5F are cross-sectional views illustrating a method of manufacturing a variable resistance structure in accordance with an example embodiment of the present invention.

DETAILED DESCRIPTION

Figure 1A:
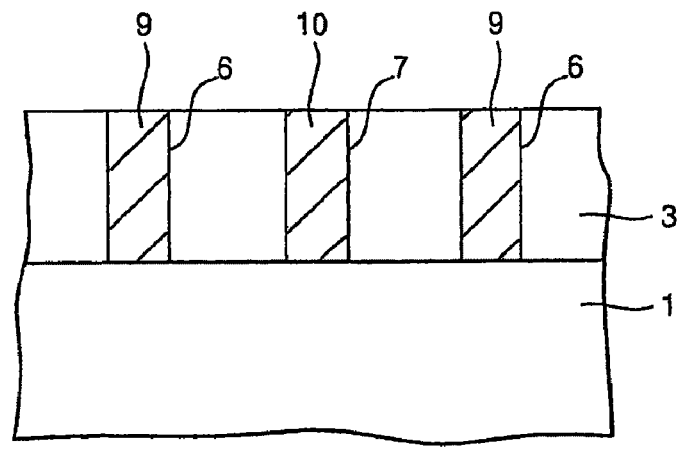
Figure 1B:
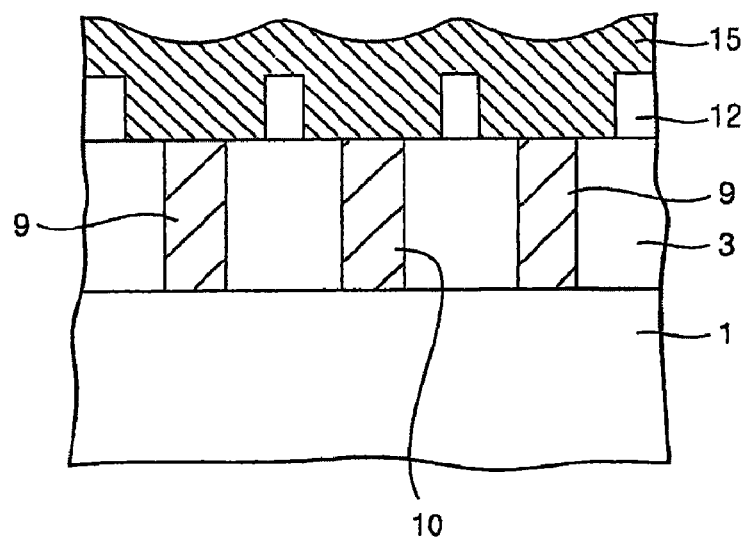
Figure 1C:
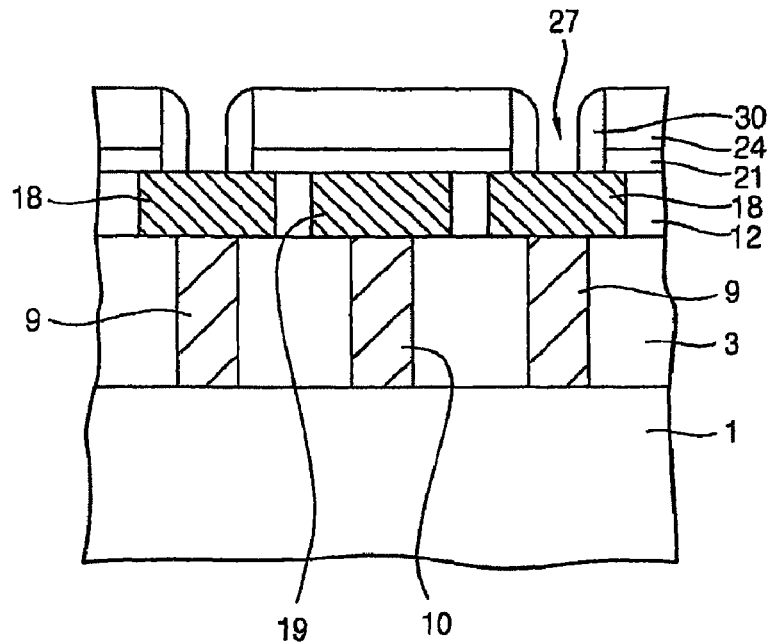
Figure 1D:
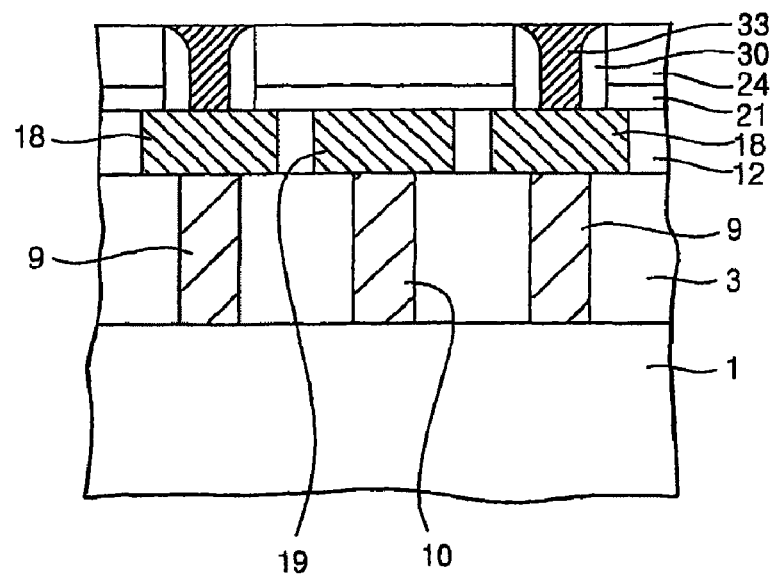
Figure 2:
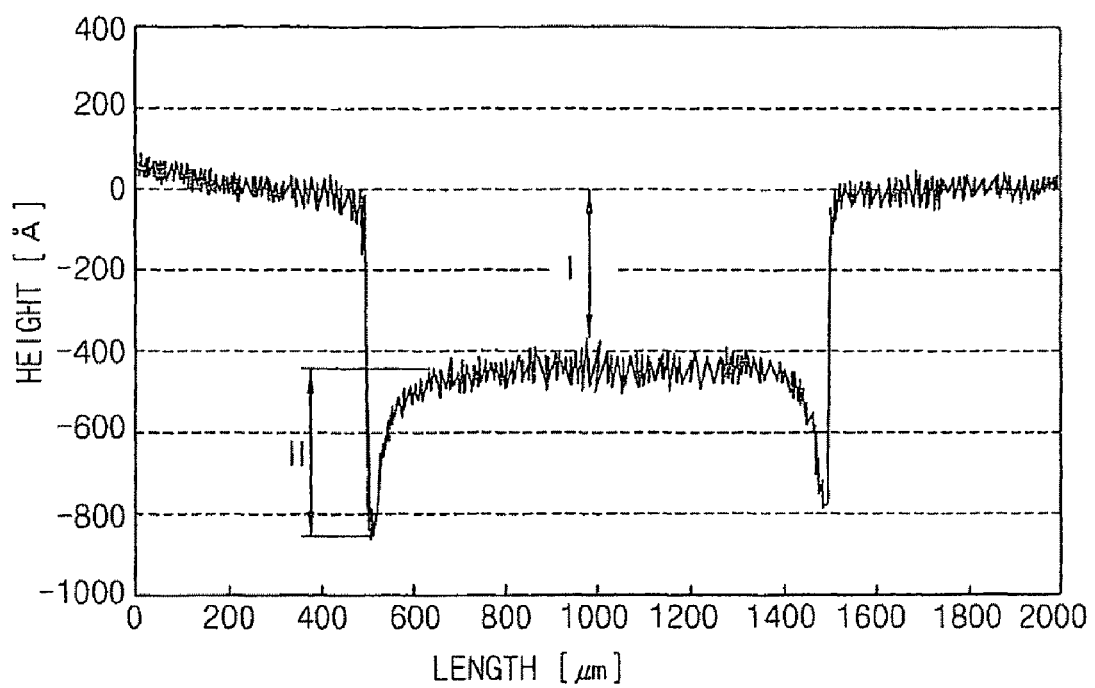
FIG. 2 is a graph illustrating defects in a metal layer pattern caused by a chemical mechanical polishing (CMP) process.
Figure 3A:
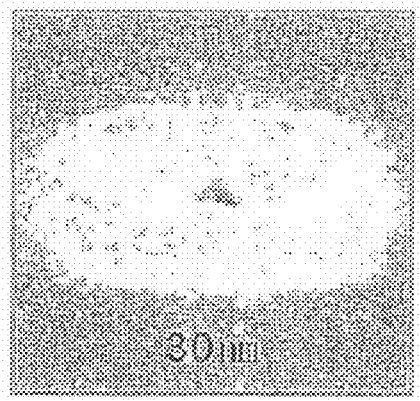
FIGS. 3A to 3C are electron microscopic pictures showing a seam generated in a pad of a conventional phase-change memory device.
Figure 3B:
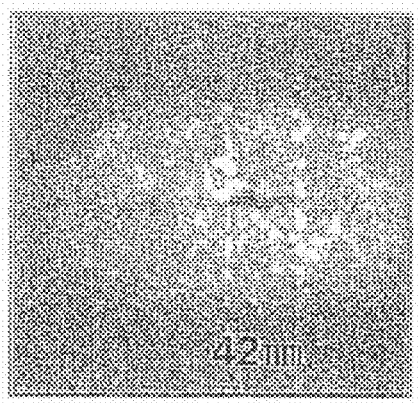
Figure 3C:
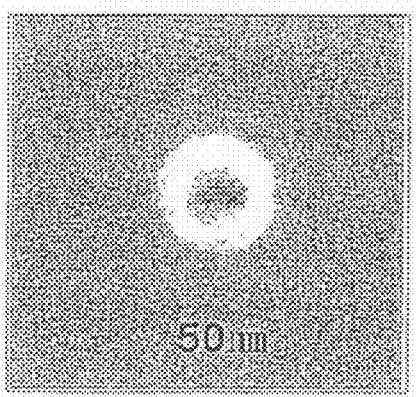
Figure 4:
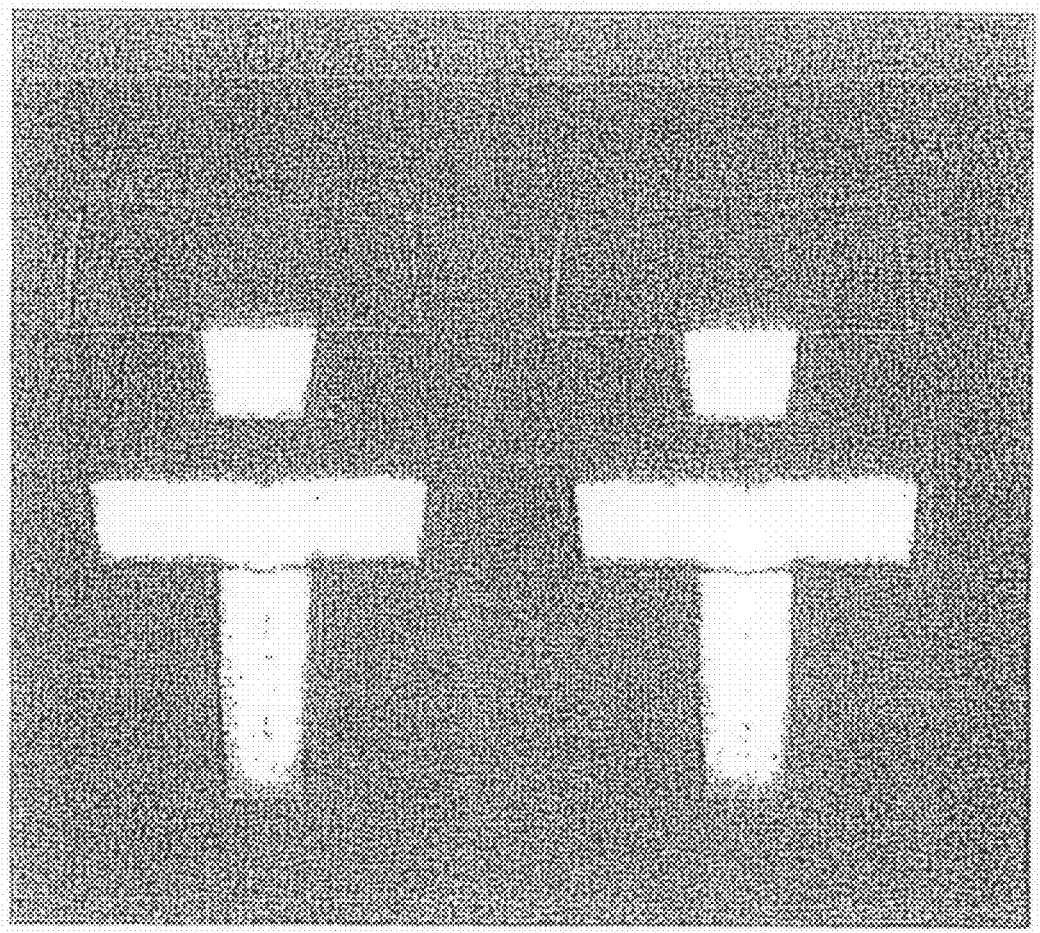
FIG. 4 is an electron microscopic picture showing a cross section of the phase-change memory device.

The present invention is described more fully hereinafter with reference to the accompanying drawings, in which embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Manufacturing a Variable Resistance Structure

FIGS. 5A to 5F are cross-sectional views illustrating a method of manufacturing a variable resistance structure in accordance with an example embodiment of the present invention.

Figure 5A:
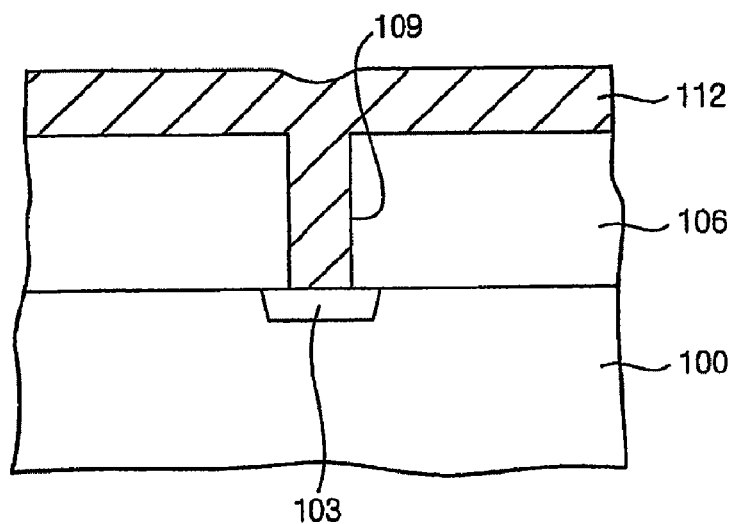

Referring to FIG. 5A, a first insulation layer 106 is formed on a substrate 100 having a contact region 103. The substrate 100 may include a silicon wafer, a silicon-on-insulator (SOI) substrate or a single crystalline metal oxide substrate. The contact region 103 may be included in a lower structure formed on the substrate 100. The lower structure may further include a conductive pattern, a mask pattern, an insulation pattern, a pad and a contact. The contact region 103 may be formed on the substrate 100 by an ion implantation process and/or a diffusion process.

The first insulation layer 106 is formed on the substrate 100 using an oxide or a nitride. For example, the first insulation layer 106 may be formed using phosphor silicate glass (PSG), boro-phosphor silicate glass (BPSG), undoped silicate glass (USG), spin-on-glass (SOG), tetraethyl orthosilicate (TEOS), plasma-enhanced TEOS (PE-TEOS), flowable oxide (FOx), high-density plasma chemical vapor deposition (HDP-CVD) oxide, or silicon nitride. Additionally, the first insulation layer 106 may be formed by, for example, a chemical vapor deposition (CVD) process, a plasma-enhanced chemical vapor deposition (PECVD) process, an atomic layer deposition (ALD) process, or an HDP-CVD process.

In an example embodiment of the present invention, the first insulation layer 106 may have a sufficient thickness to completely cover the lower structure when the lower structure is formed on the substrate 100.

After forming a first photoresist pattern (not shown) on the first insulation layer 106, the first insulation layer 106 is partially etched using the first photoresist pattern as an etching mask, thereby forming a contact hole 109 that partially exposes the contact region 103 formed on the substrate 100. For example, the contact hole 109 may be formed through the first insulation layer 106 by an anisotropic etching process.

A preliminary first conductive layer 112 is formed on the exposed contact region 103 and the first insulation layer 106 to fill up the contact hole 109. The preliminary first conductive layer 112 may be formed using a conductive material including, but not limited to, polysilicon doped with impurities, a metal, or a conductive metal nitride. For example, the preliminary first conductive layer 112 may be formed using tungsten (W), titanium (Ti), tantalum (Ta), aluminum (Al), copper (Cu), tungsten nitride (WN), titanium nitride (TiN), tantalum nitride (TaN), aluminum nitride (AlN), or titanium aluminum nitride (TiAlN). In addition, the preliminary first conductive layer 112 may be formed by, for example, a sputtering process, a CVD process, an ALD process, an electron beam evaporation process, or a pulsed laser deposition (PLD) process.

Since the preliminary first conductive layer 112 is formed on the first insulation layer 106 to fill up the contact hole 109, a stepped portion having a relatively small size may be generated at a portion of the preliminary first conductive layer 112 positioned directly over the contact hole 109. Additionally, since the preliminary first conductive layer 112 is directly formed on the first insulation layer 106, the preliminary first conductive layer 112 may have a relatively rough surface.

Figure 5B:
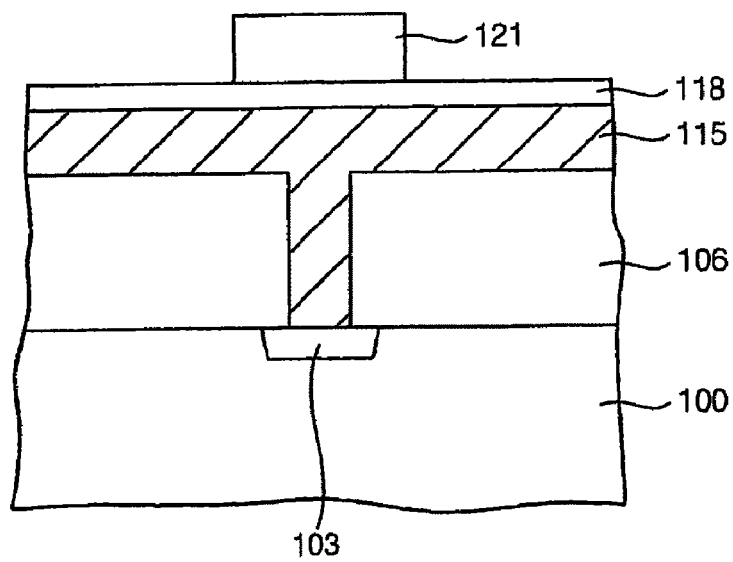

Referring to FIG. 5B, to remove the stepped portion of the preliminary first conductive layer 112 and to improve surface conditions of the preliminary first conductive layer 112, a surface treatment process is performed with respect to the preliminary first conductive layer 112, thereby forming a first conductive layer 115 having improved surface conditions without any stepped portions. In one example embodiment of the present invention, an upper portion of the preliminary first conductive layer 112 may be polished through a chemical mechanical polishing (CMP) process using a slurry so that the first conductive layer 115 may have an improved surface roughness while removing the stepped portion from the first conductive layer 115. The slurry may include an abrasive such as ceria, silica, alumina, and/or titania. For example, the surface treatment process may be carried out for about 10 seconds to about 60 seconds. In another example embodiment of the present invention, an etch-back process may be employed for forming the first conductive layer 115 having the improved surface roughness without the stepped portion.

A first protection layer 118 is formed on the first conductive layer 115. The first protection layer 118 may be formed using a nitride or an oxynitride. For example, the first protection layer 118 may be formed using silicon nitride or silicon oxynitride. The first protection layer 118 may be formed by a CVD process, a PECVD process, an ALD process, or an HDP-CVD process.

A second photoresist pattern 121 is formed on the first protection layer 118. The second photoresist pattern 121 is formed by exposing and developing a second photoresist film (not shown) after the second photoresist film is formed on the first protection layer 118.

Referring to FIG. 5C, the first protection layer 118 and the first conductive layer 115 are patterned using the second photoresist pattern 121 as an etching mask to thereby form a first protection layer pattern 130, a pad 127 and a contact 124. The first protection layer pattern 130, the pad 127 and the contact 124 may be formed by a dry etching process. The contact 124 makes contact with the contact region 103 formed on the substrate 100 to fill up the contact hole 109. The pad 127 is formed on the contact 124. The pad 127 may be integrally formed with the contact 124. The first protection layer pattern 130 is positioned on the pad 127. The first protection layer pattern 130 serves as an etching mask while etching the first conductive layer 115. Additionally, the first protection layer pattern 130 supports a first electrode 151 (see FIG. 5F) successively formed. In one example embodiment of the present invention, the contact 124 and the pad 127 may be simultaneously formed on the substrate 100. Here, the contact 124 and the pad 127 may be integrally formed. In another example embodiment of the present invention, the first protection layer 118 may be etched only using the second photoresist pattern 121 as an etching mask to thereby form the first protection layer pattern 130. Then, the first conductive layer 115 may be etched using the first protection layer pattern 130 as an etching mask so that the pad 127 and the contact 124 may be simultaneously formed on the substrate 100.

After the second photoresist pattern 121 is removed from the first protection layer pattern 130, a second insulation layer 133 is formed on the first insulation layer 106 to cover the first protection layer pattern 130. The second photoresist pattern 121 may be removed by an ashing process and/or a stripping process. The second insulation layer 133 may be formed by, for example, a CVD process, a PECVD process, an ALD process, or an HDP-CVD process. The second insulation layer 133 may be formed using an oxide. For example, the second insulation layer 133 may be formed using PSG, BPSG, FOX, SOG, USG, TEOS, PE-TEOS, or HDP-CVD oxide. In one example embodiment of the present invention, the second insulation layer 133 may be formed using an oxide substantially the same as that of the first insulation layer 106. In another example embodiment of the present invention, the first and second insulation layers 106 and 133 may be formed using oxides substantially different from each other.

The second insulation layer 133 is partially removed by a CMP process, an etch-back process or a combination process of CMP and etch-back until the first protection layer pattern 130 is exposed, thereby planarizing the second insulation layer 133. In an example embodiment of the present invention, the second insulation layer 133 is planarized by the CMP process using a slurry that includes an abrasive containing ceria. In the CMP process, since the abrasive containing ceria has a relatively high etching selectivity between an oxide and a nitride, the second insulation layer 133 may be planarized without causing damage to the first protection layer pattern 130. Here, the first protection layer pattern 130 may serve as a polishing stop layer. The pad 127 and the first protection layer pattern 130 may be buried in the planarized second insulation layer 133.

Referring to FIG. 5D, a second protection layer 136 and a sacrificial layer 139 are sequentially formed on the second insulation layer 133 and the first protection layer pattern 130. The second protection layer 136 may be formed by a CVD process, a PECVD process, an ALD process or an HDP-CVD process. The second protection layer 136 may be formed using a nitride or an oxynitride. For example, the second protection layer 136 may be formed using silicon nitride or silicon oxynitride. In one example embodiment of the present invention, the second protection layer 136 may be formed using a material substantially the same as that of the first protection layer 118. In another example embodiment of the present invention, the second protection layer 136 may be formed using a material substantially different from that of the first protection layer 118.

The sacrificial layer 139 may be formed by a CVD process, a PECVD process, an ALD process, or an HDP-CVD process. The sacrificial layer 139 may be formed using an oxide such as PSG, BPSG, FOX, SOG, USG, TEOS, PE-TEOS, or HDP-CVD oxide. In one example embodiment of the present invention, the sacrificial layer 139 may be formed using an oxide substantially the same as that of the first insulation layer 106 and/or the second insulation layer 133. In another example embodiment of the present invention, the sacrificial layer 139 may be formed using an oxide substantially different from that of the first insulation layer 106 and/or the second insulation layer 133.

After forming a third photoresist pattern (not shown) on the sacrificial layer 139, the sacrificial layer 139, the second protection layer 136 and the first protection layer pattern 130 are partially etched using the third photoresist pattern as an etching mask, thereby forming an opening 142 that exposes the pad 127.

After the third photoresist pattern is removed from the sacrificial layer 139 by an ashing process and/or a stripping process, a third insulation layer is formed on the exposed pad 127, a sidewall of the opening 142 and the sacrificial layer 139. The third insulation layer may be formed by a CVD process, a PECVD process, an ALD process, or an HDP-CVD process. The third insulation layer may be formed using a nitride. For example, the third insulation layer may be formed using silicon nitride.

The third insulation layer is partially etched by an anisotropic etching process so that a preliminary spacer 145 is formed on the sidewall of the opening 142. The preliminary spacer 145 may reduce the width of the preliminary first electrode 148 (see FIG. 5E) successively formed. When the preliminary spacer 145 is formed on the sidewall of the opening 142, the preliminary first electrode 148 buried in the opening 142 may have a reduced width because a diameter of the opening 142 is reduced by about twice the thickness of the preliminary spacer 145.

Figure 5E:
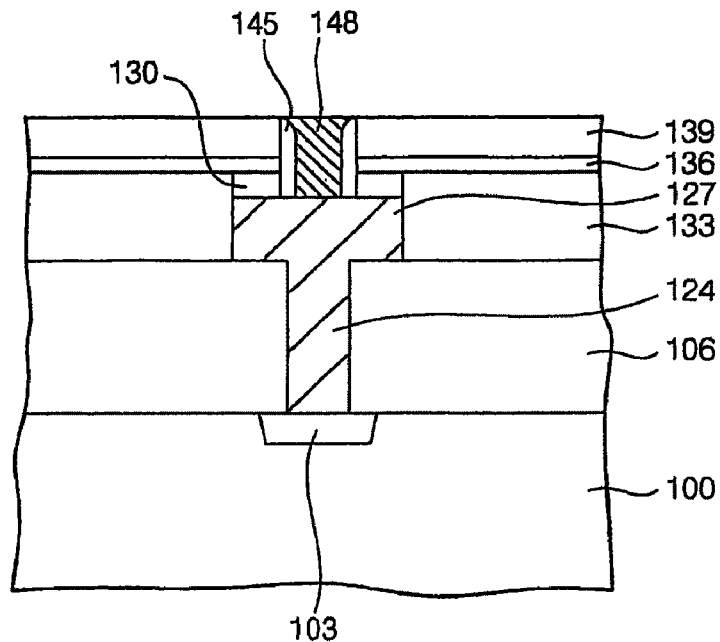

Referring to FIG. 5E, a second conductive layer is formed on the pad 127 and the sacrificial layer 139 to fill up the opening 142. The second conductive layer may be formed using a conductive material such as doped polysilicon, a metal, or a conductive metal nitride. For example, the second conductive layer may be formed using tungsten (W), titanium (Ti), titanium nitride (TiN), tantalum (Ta), tantalum nitride (TaN), molybdenum nitride (MoN), niobium nitride (NbN), titanium silicon nitride (TiSiN), aluminum (Al), titanium aluminum nitride (TiAlN), titanium boron nitride (TiBN), zirconium silicon nitride (ZrAlN), molybdenum silicon nitride (MoSiN), molybdenum aluminum nitride (MoAlN), tantalum silicon nitride (TaSiN), or tantalum aluminum nitride (TaAlN). These can be used alone or in a mixture thereof. The second conductive layer may be formed by, for example, a sputtering process, a CVD process, an electron beam evaporation process, an ALD process, or a PLD process.

The second conductive layer is removed by a CMP process until the sacrificial layer 139 is exposed, to thereby form the preliminary first electrode 148 in the opening 142. Here, the preliminary spacer 145 is positioned on a sidewall of the preliminary first electrode 148.

Figure 5F:
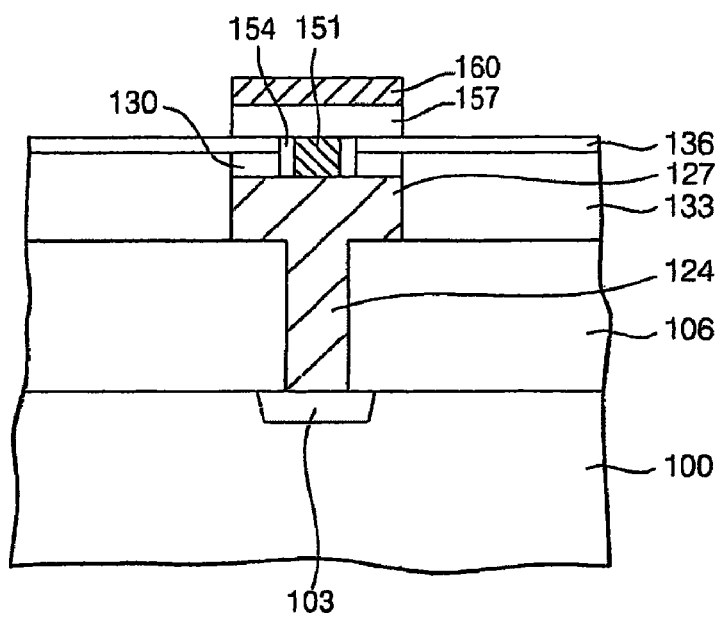

Referring to FIG. 5F, the sacrificial layer 139 is removed to expose the second protection layer 136. The sacrificial layer 139 may be removed by an etch-back process. When the sacrificial layer 139 is removed, the preliminary spacer 145 and the preliminary first electrode 148 are partially protruded from the second protection layer 136. The protruding portions of the preliminary spacer 145 and the preliminary first electrode 148 may have pillar shapes, respectively.

The protruding portions of the preliminary first electrode 148 and the preliminary spacer 145 are removed to form a first electrode 151 and a spacer 154 on the pad 127. The first electrode 151 and the spacer 154 may be formed by a CMP process. The spacer 154 and the first electrode 151 may be buried in the first protection layer pattern 130 and the second protection layer 136. In other words, the first protection layer pattern 130 and the second protection layer 136 may enclose together the spacer 154 and the first electrode 151 so that the first electrode 151 may be stably supported on the pad 127 by the first protection layer pattern 130 and the second protection layer 136.

A phase-change material layer and the third conductive layer are sequentially formed on the first electrode 151 and the second protection layer 136. The phase-change material layer may be formed using a chalcogenide compound that includes a compound including an element in Group 16 of the Periodic Table of Elements except for oxygen. For example, the phase-change material layer may be formed using a compound that includes germanium-antimony-tellurium (GeSbTe; GST), arsenic-antimony-tellurium (AsSbTe), tin-antimony-tellurium (SnSbTe), tin-indium-antimony-tellurium (SnInSbTe), or arsenic-germanium-antimony-tellurium (AsGeSbTe). The phase-change material may be formed using a compound that includes (an element in Group 5)-antimony-tellurium, the Group 5 element being an element such as tantalum, niobium or vanadium. The phase-change material may be formed using a compound that includes (an element in Group 6)-antimony-tellurium, the Group 6 element being an element such as tungsten, molybdenum or chromium. The phase-change material may be formed using a compound that includes (an element in Group 5)-antimony-selenium, or a compound that includes (an element in Group 6)-antimony-selenium. The third conductive layer may be formed using polysilicon doped with impurities, a metal or a conductive metal nitride. For example, the third conductive layer may be formed using tungsten (W), titanium (Ti), titanium nitride (TiN), tantalum (Ta), tantalum nitride (TaN), molybdenum nitride (MoN), niobium nitride (NbN), titanium silicon nitride (TiSiN), aluminum (Al), titanium aluminum nitride (TiAlN), titanium boron nitride (TiBN), zirconium silicon nitride (ZrAlN), molybdenum silicon nitride (MoSiN), molybdenum aluminum nitride (MoAlN), tantalum silicon nitride (TaSiN), or tantalum aluminum nitride (TaAlN). These can be used alone or in a mixture thereof. Additionally, the third conductive layer may be formed by a sputtering process, a CVD process, an electron beam evaporation process, an ALD process, or a PLD process.

After forming a fourth photoresist pattern (not shown) on the third conductive layer, the third conductive layer and the phase-change material layer are patterned using the fourth photoresist pattern as an etching mask, thereby forming a phase-change material layer pattern 157 and the second electrode 160 on the first electrode 151 and the second protection layer 136. As a result, a variable resistance structure 170 is formed on the substrate 100.

FIGS. 6A to 6F are cross-sectional views illustrating a method of manufacturing a variable resistance structure in accordance with an example embodiment of the present invention.

Figure 6A:
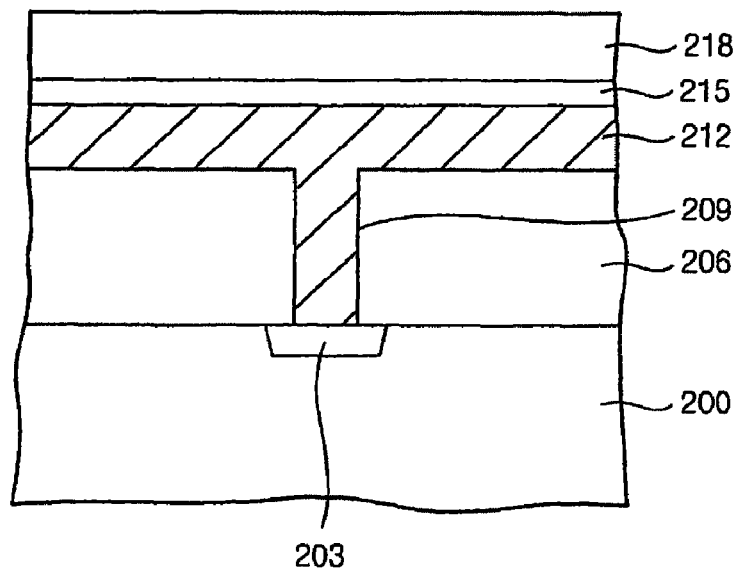
FIGS. 6A to 6F are cross-sectional views illustrating a method of manufacturing a variable resistance structure in accordance with an example embodiment of the present invention.

Referring to FIG. 6A, a contact region 203 is formed on the substrate 200 such as a silicon wafer, an SOI substrate or a single crystalline metal oxide substrate. The contact region 203 may be formed on the substrate 200 by an ion implantation process and/or a diffusion process. In an example embodiment of the present invention, the substrate 200 further includes a lower structure (not shown) having a conductive pattern, a pad, a gate structure and/or a transistor as well as the contact region 203.

A first insulation layer 206 is formed on the substrate 200 having the contact region 203. The first insulation layer 206 may be formed on the substrate 200 using an oxide. For example, the first insulation layer 110 may be formed using BPSG, PSG, USG, SOG, FOX, TEOS, PE-TEOS, or HDP-CVD oxide. The first insulation layer 206 may be formed by a CVD process, a PECVD process, or an HDP-CVD process.

After forming a first photoresist pattern (not shown) on the first insulation layer 206, the first insulation layer 206 is partially etched using the first photoresist pattern as an etching mask. Thus, a contact hole 209 that exposes the contact region 203 is formed through the first insulation layer 206.

After the first photoresist pattern is removed by an ashing process and/or a stripping process, a preliminary first conductive layer is formed on the first insulation layer 206 to fill up the contact hole 209. The preliminary first conductive layer may be formed using doped polysilicon, a metal, or a conductive metal nitride. For example, the preliminary first conductive layer may be formed using tungsten (W), titanium (Ti), titanium nitride (TiN), tantalum (Ta), tantalum nitride (TaN), molybdenum nitride (MoN), niobium nitride (NbN), titanium silicon nitride (TiSiN), aluminum (Al), titanium aluminum nitride (TiAlN), titanium boron nitride (TiBN), zirconium silicon nitride (ZrAlN), molybdenum silicon nitride (MoSiN), molybdenum aluminum nitride (MoAlN), tantalum silicon nitride (TaSiN), or tantalum aluminum nitride (TaAlN). These can be used alone or in a mixture thereof. The preliminary first conductive layer may be formed by a sputtering process, a CVD process, an electron beam evaporation process, an ALD process, or a PLD process.

An upper portion of the preliminary first conductive layer may be polished by a surface treatment process so as to remove a stepped portion generated at the upper portion of the preliminary first conductive layer, thereby forming a first conductive layer 212 having an improved surface roughness. For example, the first conductive layer 212 may be formed by a CMP process using an abrasive that contains ceria, silica, alumina, or titania.

A first protection layer 215 and a second photoresist film 218 are sequentially formed on the first conductive layer 212. The first protection layer 215 may be formed using silicon nitride or silicon oxynitride. The first protection layer 215 may be formed by a CVD process, a PECVD process, an ALD process, or an HDP-CVD process.

Figure 6B:
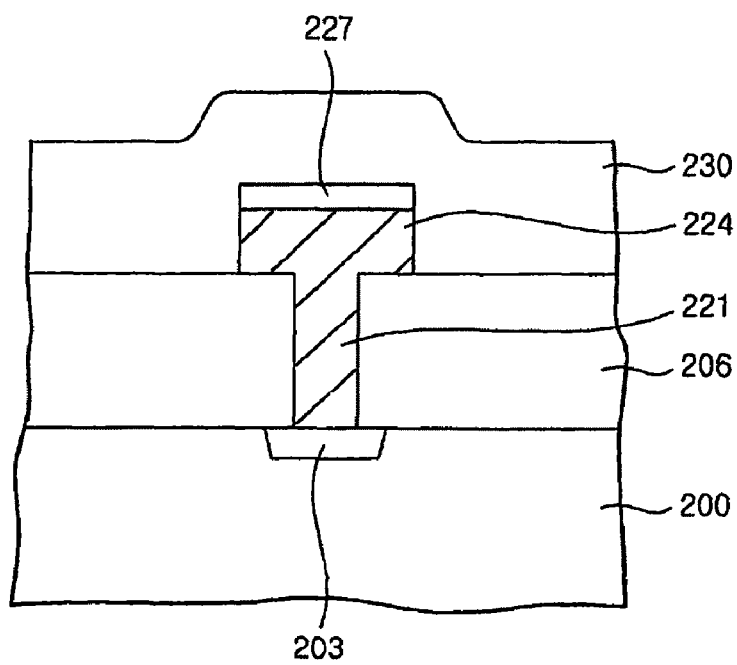

Referring to FIG. 6B, the second photoresist film 218 is exposed and developed to form a second photoresist pattern (not shown) on the first protection layer 215. The first protection layer 215 is patterned using the second photoresist pattern as an etching mask, thereby forming a first protection layer pattern 227 on the first conductive layer 212. The first protection layer pattern 227 may serve as an etching mask in an etching process for etching the first conductive layer 212. In addition, the first protection layer pattern 227 may support a phase-change material layer pattern 248 (see FIG. 6F) successively formed. The second photoresist pattern may be removed from the first protection layer pattern 227 by an ashing process and/or a stripping process.

The first conductive layer 212 is etched using the first protection layer pattern 227 as an etching mask to simultaneously form a contact 221 and a first electrode 224. The contact 221 makes contact with the contact region 203 and the first electrode 224 is located on the contact 221 and the first insulation layer 206. The contact 221 and the first electrode 224 may be formed by a dry etching process. The first electrode 224 is electrically connected to the contact region 203 through the contact 221 integrally formed with the first electrode 224.

A second insulation layer 230 is formed on the first insulation layer 206 to cover the first electrode 224 and the first protection layer pattern 227. The second insulation layer 230 may be formed using an oxide by a CVD process, a PECVD process, an ALD process, or an HDP-CVD process. For example, the second insulation layer 230 may be formed using BPSG, PSG, USG, SOG, FOX, TEOS, PE-TEOS, or HDP-CVD oxide.

Figure 6C:
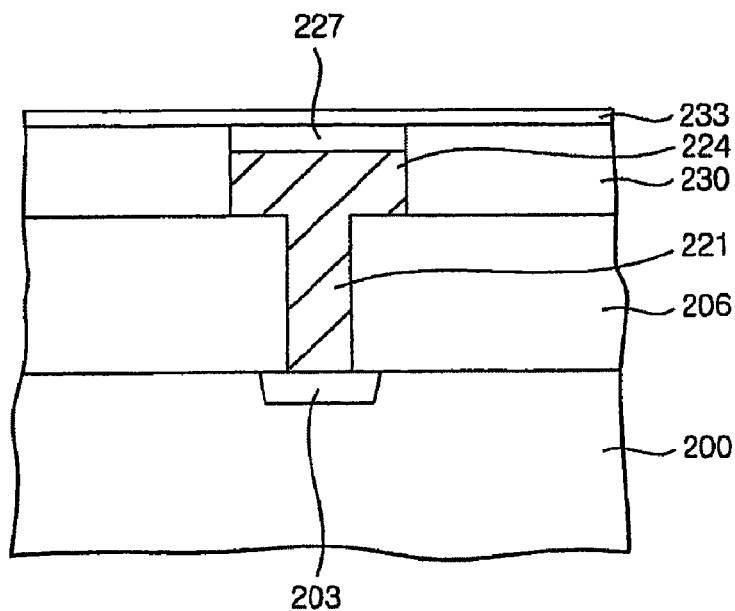

Referring to FIG. 6C, the second insulation layer 230 is partially removed until the first protection layer pattern 227 is exposed, thereby planarizing the second insulation layer 230. The second insulation layer 230 may be partially removed by a CMP process, an etch-back process or a combination process of CMP and etch-back. When the second insulation layer 230 is planarized, the first protection layer pattern 227 and the first electrode 224 may be buried in the second insulation layer 230.

A second protection layer 233 is formed on the first protection layer pattern 227 and the second insulation layer 230. The second protection layer 233 may be formed using silicon nitride or silicon oxynitride. The second protection layer 233 may be formed by a CVD process, a PECVD process, an ALD process, or an HDP-CVD process.

Figure 6D:
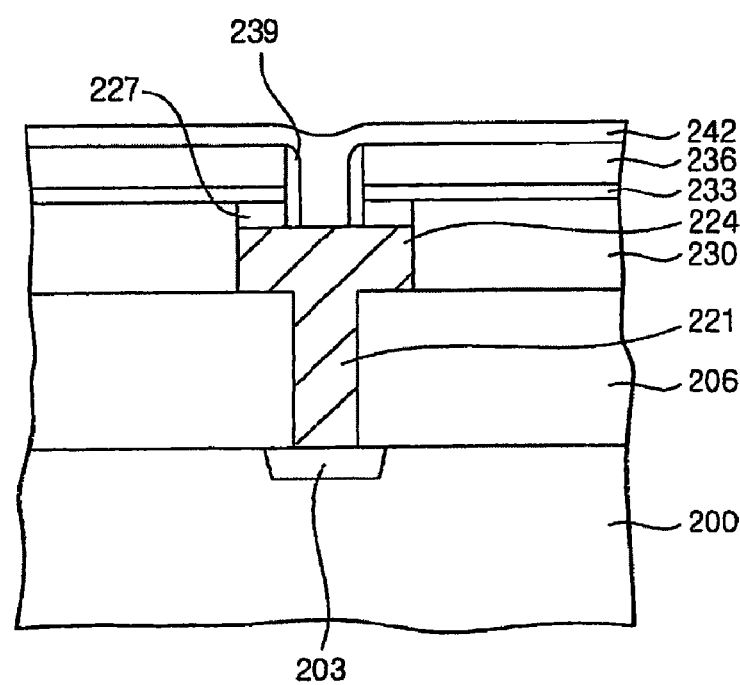

Referring to FIG. 6D, a sacrificial layer 236 and a third photoresist pattern (not shown) are formed on the second protection layer 233. The sacrificial layer 236, the second protection layer 233 and the first protection layer pattern 221 are partially etched using the third photoresist pattern as an etching mask, thereby forming an opening that exposes the first electrode 224.

After removing the third photoresist pattern, a third insulation layer is formed on a sidewall of the opening and the sacrificial layer 236. The third insulation layer may be formed using a nitride such as silicon nitride by a CVD process, a PECVD process, an ALD process, or an HDP-CVD process.

The third insulation layer is etched by an anisotropic etching process to form a preliminary spacer 239 on the sidewall of the opening. When the preliminary spacer 239 is formed on the sidewall of the opening, the width of the opening may be reduced by twice a thickness of the preliminary spacer 239. Thus, a preliminary phase-change material layer pattern 245 (see FIG. 6E) buried in the opening may have a reduced width.

A phase-change material layer 242 is formed on the first electrode 224 and the sacrificial layer 236 to fill up the opening. The phase-change material layer 242 may be formed using a chalcogenide compound. For example, the phase-change material layer 242 may be formed using a compound that includes germanium-antimony-tellurium (GeSbTe; GST), arsenic-antimony-tellurium (AsSbTe), tin-antimony-tellurium (SnSbTe), tin-indium-antimony-tellurium (SnInSbTe), or arsenic-germanium-antimony-tellurium (AsGeSbTe). The phase-change material may be formed using a compound that includes (an element in Group 5)-antimony-tellurium, the Group 5 element being an element such as tantalum, niobium or vanadium. The phase-change material may be formed using a compound that includes (an element in Group 6-antimony-tellurium, the Group 6 element being an element such as tungsten, Molybdenum or chromium. The phase-change material may be formed using a compound that includes (an in element Group 5)-antimony-selenium, or a compound that includes (an element in Group 6)-antimony-selenium.

Figure 6E:
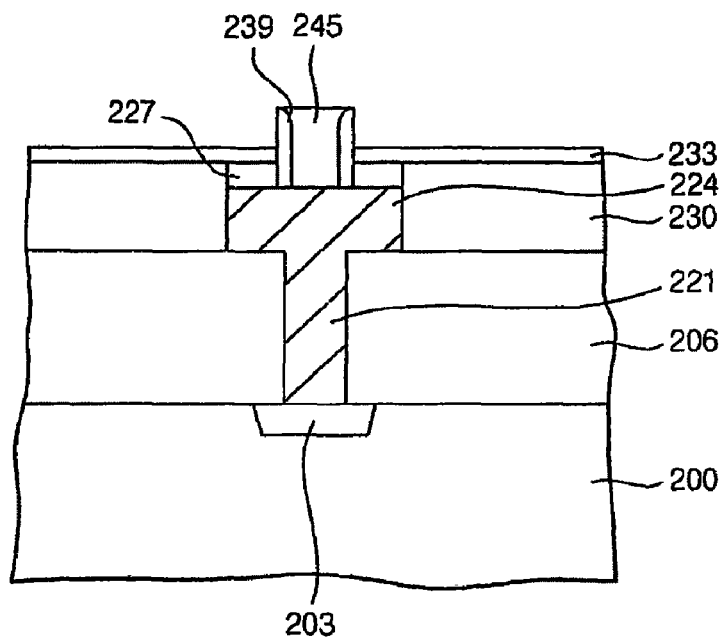

Referring to FIG. 6E, the phase-change material layer 242 is partially removed by a CMP process until the sacrificial layer 236 is exposed, so that the preliminary phase-change material layer pattern 245 filling up the opening is formed on the first electrode 224. For example, the preliminary phase-change material layer pattern 245 may be formed using a slurry that includes an abrasive containing ceria.

The sacrificial layer 236 is removed by an etch-back process to expose the second protection layer 233. Thus, the preliminary phase-change material layer pattern 245 and the preliminary spacer 239 may be protruded from the second protection layer 233. For example, the preliminary phase-change material layer pattern 245 and the preliminary spacer 239 may be protruded from the second protection layer 233 as pillar shapes.

Figure 6F:
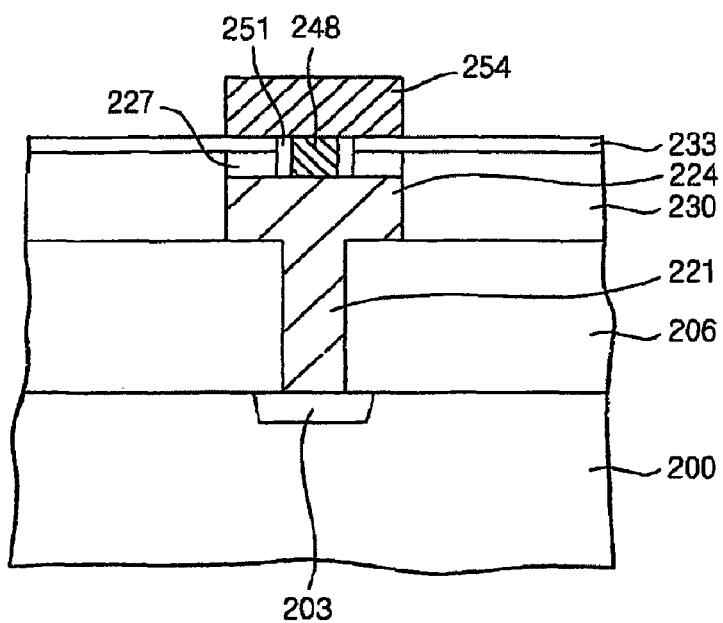

Referring to FIG. 6F, protruding portions of the preliminary phase-change material layer pattern 245 and the preliminary spacer 239 are partially removed to thereby simultaneously form a spacer 251 and a phase-change material layer pattern 248 on the first electrode 224. The spacer 251 and the phase-change material layer pattern 248 may be formed by a CMP process. In the CMP process, the second protection layer 233 may serve as a polishing stop layer. For example, the preliminary phase-change material layer pattern 245 and the preliminary spacer 239 may be polished using a slurry that includes an abrasive containing ceria.

A third conductive layer is formed on the second protection layer 233, the spacer 251 and the phase-change material layer pattern 248. The third conductive layer may be formed using polysilicon doped with impurities, a metal, or a conductive material nitride. For example, the third conductive layer may be formed using tungsten, titanium, titanium nitride, tantalum, tantalum nitride, molybdenum nitride, niobium nitride, titanium silicon nitride, aluminum, titanium aluminum nitride, titanium boron nitride, zirconium aluminum nitride, molybdenum silicon nitride, molybdenum aluminum nitride, tantalum silicon nitride, or tantalum aluminum nitride. These can be used alone or in a mixture thereof. The third conductive layer may be formed by a sputtering process, a CVD process, an electron beam evaporation process, an ALD process, or a PLD process.

After forming a fourth photoresist pattern (not shown) on the third conductive layer, the third conductive layer is partially etched using the fourth photoresist pattern as an etching mask. Thus, a second electrode 254 is formed on the phase-change material layer pattern 248 and the second protection layer 233. As a result, a variable resistance structure 270 is fabricated over the substrate 200.

Method of Manufacturing a Phase-Change Memory Device

FIGS. 7A to 7M are cross-sectional views illustrating a method of manufacturing a phase-change memory device in accordance with an example embodiment of the present invention.

Figure 7A:
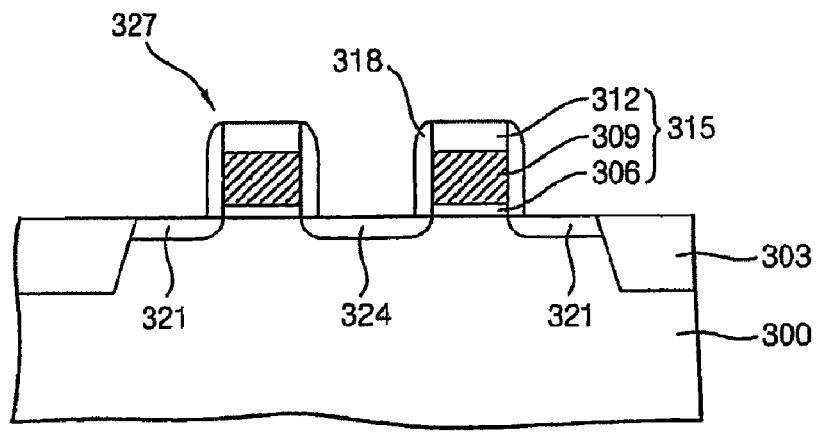
FIGS. 7A to 7M are cross-sectional views illustrating a method of manufacturing a phase-change semiconductor memory device in accordance with an example embodiment of the present invention.

Referring to FIG. 7A, an isolation layer 303 is formed on a semiconductor substrate 300 to define an active region and a field region on the semiconductor substrate 300. The isolation layer 303 may be formed by an isolation process such as a shallow trench isolation (STI) process or a local oxidation of silicon (LOCOS) process. The isolation layer 303 may be formed using an oxide such as silicon oxide.

After a gate insulation layer, a gate conductive layer and a gate mask layer are sequentially formed on the semiconductor substrate 300, the gate mask layer, the gate conductive layer and the gate insulation layer are successively etched, thereby forming a gate structure 315 on the semiconductor substrate 300. The gate structure 315 includes a gate insulation layer pattern 306, a gate electrode 309 and a gate mask pattern 312. The gate electrode 309 may have a single layer structure that includes a doped polysilicon layer, a metal layer or a conductive metal nitride layer. The gate electrode 309 may have a multilayer structure that includes a doped polysilicon layer, a metal layer and/or a conductive metal nitride layer. The gate mask pattern 312 may be formed using a material having an etching selectivity relative to the gate electrode 309 and the gate insulation layer pattern 306. For example, the gate mask pattern 312 may be formed using a nitride such as silicon nitride or an oxynitride such as silicon oxynitride.

After forming a first insulation layer on the semiconductor substrate 300 to cover the gate mask pattern 312, the first insulation layer may be anisotropically etched so that a gate spacer 318 is formed on a sidewall of the gate structure 315. The first insulation layer may be formed using a nitride such as silicon nitride.

A first contact region 321 and a second contact region 324 are formed at portions of the semiconductor substrate 300 exposed between the gate structures 315 through an ion implantation process using the gate structures 315 as ion implantation masks. As a result, transistors 327 including the gate structures 315 and the first and the second contact regions 321 and 324 are formed on the semiconductor substrate 300. For example, the first contact region 312 and the second contact region 324 may correspond to a source region and a drain region, respectively.

Figure 7B:
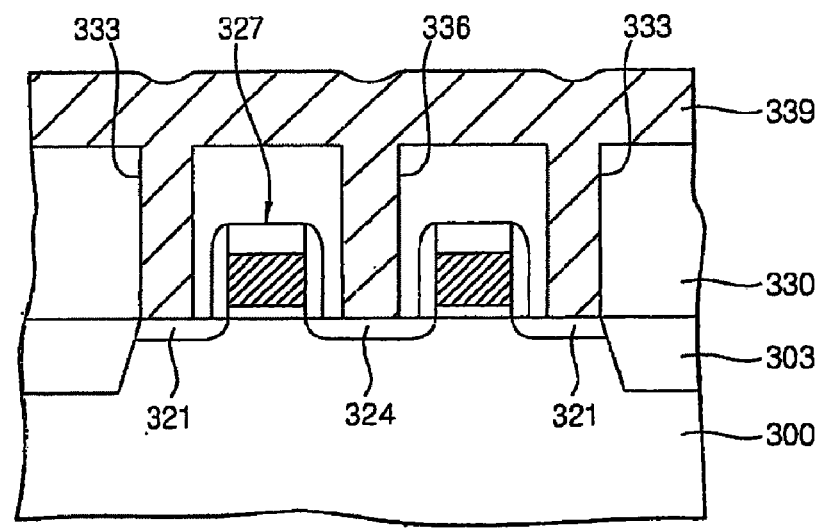

Referring to FIG. 7B, a first insulating interlayer 330 is formed on the semiconductor substrate 300 to cover the transistors 327. The first insulating interlayer 330 may be formed using an oxide such as BPSG, PSG, TEOS, PE-TEOS, USG, FOX, or HDP-CVD oxide. Additionally, the first insulating interlayer 330 may be formed by a CVD process, a PECVD process, an ALD process, or an HDP-CVD process. In an example embodiment of the present invention, the first insulating interlayer 330 may be planarized by a CMP process, an etch-back process or a combination process of CMP and etch-back.

The first insulating interlayer 330 is partially etched to form a first contact hole 333 and a second contact hole 336 through the first insulating interlayer 330. The first and the second contact holes 333 and 336 expose the first and the second contact regions 321 and 324, respectively.

A preliminary first conductive layer 339 is formed on the first insulating interlayer 330 to fill up the first and the second contact holes 333 and 336. The preliminary first conductive layer 339 may be formed by a sputtering process, a CVD process, a PECVD process, an ALD process, an electronic beam evaporation process, or a PLD process. In addition, the preliminary first conductive layer 339 may be formed using polysilicon doped with impurities, a metal, or a conductive metal nitride. For example, the preliminary first conductive layer 339 may be formed using tungsten, titanium, titanium nitride, tantalum, tantalum nitride, molybdenum nitride, niobium nitride, titanium silicon nitride, aluminum, titanium aluminum nitride, titanium boron nitride, zirconium aluminum nitride, molybdenum silicon nitride, molybdenum aluminum nitride, tantalum silicon nitride, or tantalum aluminum nitride. These can be used alone or in a mixture thereof.

Figure 8A:
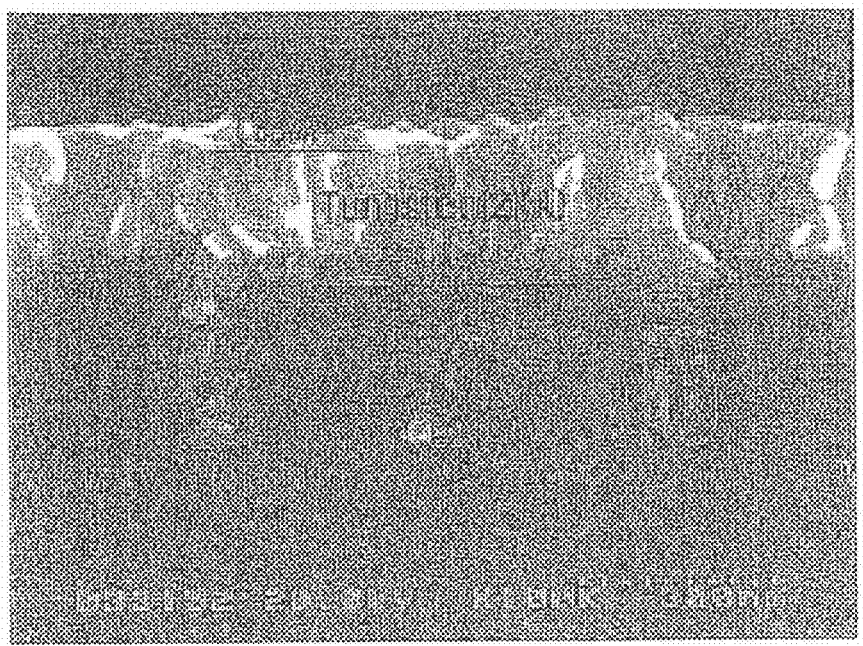
FIG. 8A is an electron microscopic picture showing a cross section of a preliminary first conductive layer in FIG. 7B.
Figure 8B:
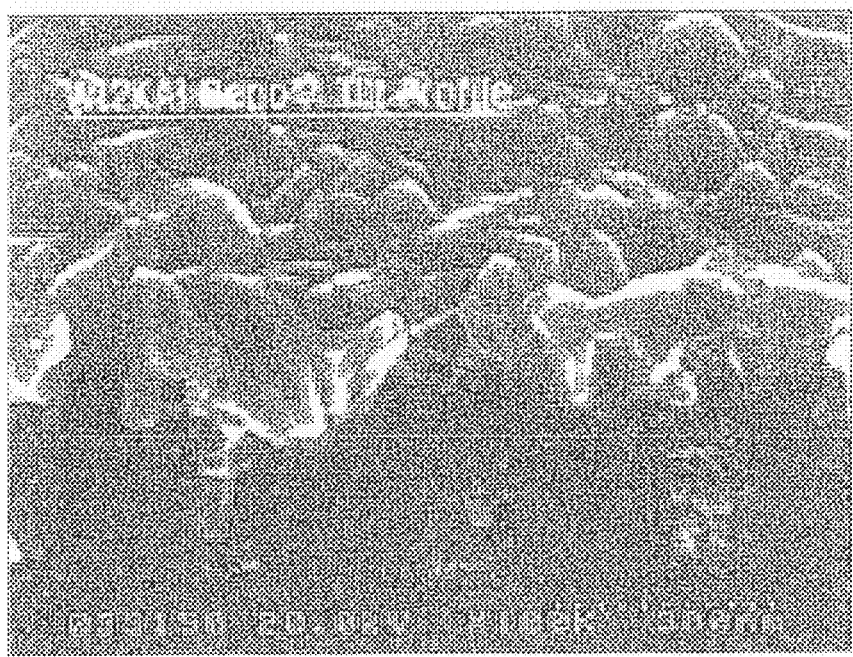
FIG. 8B is an electron microscopic picture showing a surface of the preliminary first conductive layer in FIG. 7B.

FIG. 8A is an electron microscopic picture illustrating a cross-section of the preliminary first conductive layer 339 in FIG. 7B. FIG. 8B is an electron microscopic picture illustrating a surface of the preliminary first conductive layer 339 in FIG. 7B. In FIGS. 8A and 8B, the preliminary first conductive layer 339 is formed using tungsten.

As shown in FIGS. 7B, 8A and 8B, the preliminary first conductive layer 339 positioned on the first insulating interlayer 330 having the first and the second contact holes 333 and 336 may have a considerably rough surface. For example, when the preliminary first conductive layer 339 has a thickness of about 2,000 Å measured from an upper face of the first insulating interlayer 330, a stepped portion between a top surface and a bottom surface of the preliminary first conductive layer 339 becomes about 500 Å. Thus, the stepped portion of the preliminary first conductive layer 339 should be removed and also a surface roughness of the preliminary first conductive layer 339 should be improved.

Figure 7C:
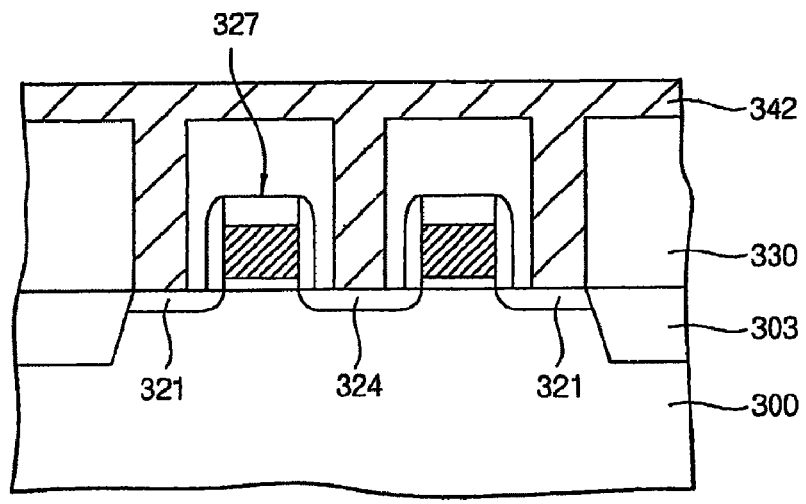

Referring to FIG. 7C, the surface of the preliminary first conductive layer 339 is treated by a CMP process so that the surface roughness of the preliminary first conductive layer 339 is improved and the stepped portion generated at the surface of the preliminary first conductive layer 339 is simultaneously removed. In the CMP process, the preliminary first conductive layer 339 may polish for about 10 seconds to about 60 seconds. Accordingly, a first conductive layer 342 having a uniform surface without a stepped portion is formed on the first insulating interlayer 330.

Figure 9A:
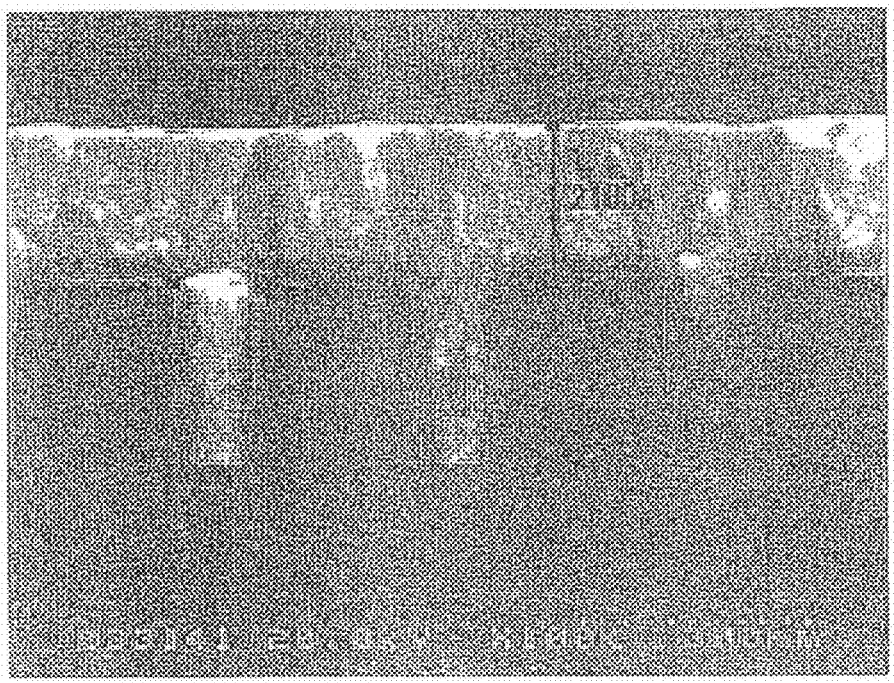
FIG. 9A is an electron microscopic picture showing a cross section of a first conductive layer in FIG. 7C.
Figure 9B:
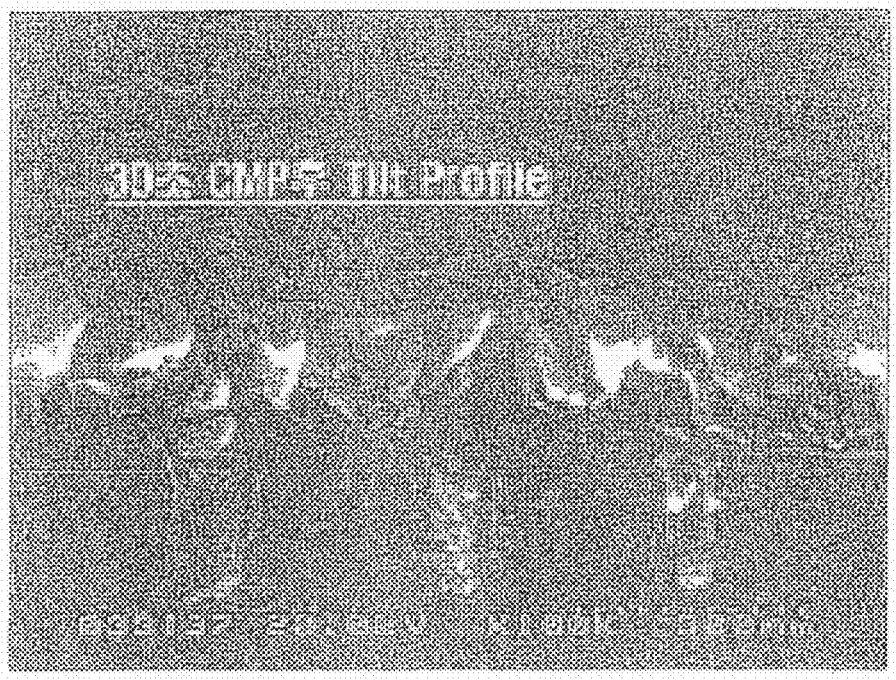
FIG. 9B is an electron microscopic picture showing a surface of the first conductive layer in FIG. 7C.

FIG. 9A is an electron microscopic picture illustrating a cross-section of the first conductive layer 342 in FIG. 7C, and FIG. 9B is an electron microscopic picture illustrating a surface of the first conductive layer 342 in FIG. 7C.

Referring to FIGS. 7C, 9A and 9B, when the first conductive layer 342 is formed through the CMP process by polishing the preliminary first conductive layer 339 for about 30 seconds, the first conductive layer 342 has a uniform surface without the stepped portion. For example, the first conductive layer 342 may have an average thickness of about 2,100 Å measured from the upper face of the first insulating interlayer 330. Additionally, the first conductive layer 342 may have an entire average thickness of about 4,800 Å based on an upper face of the semiconductor substrate 300.

Figure 7D:
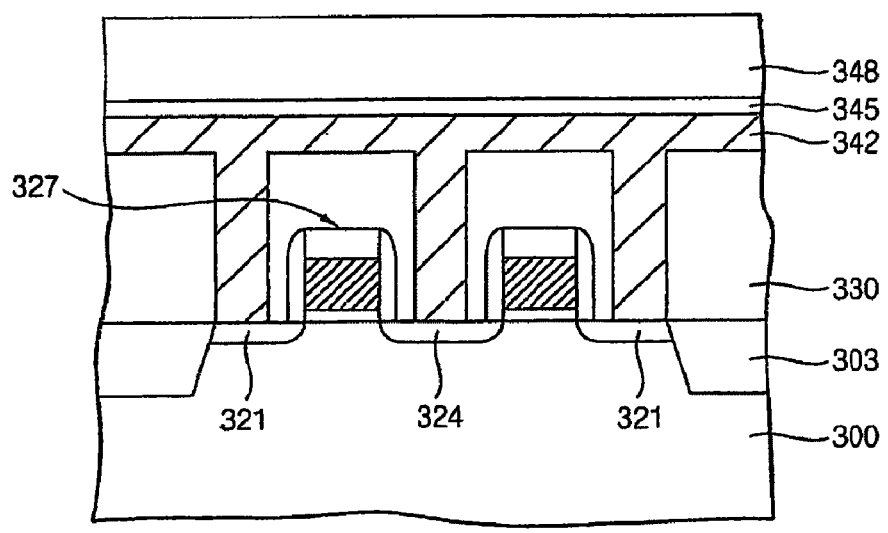

Referring to FIG. 7D, a first protection layer 345 and a photoresist film 348 are sequentially formed on the first conductive layer 342. The first protection layer 345 may be formed using a nitride such as silicon nitride or an oxynitride such as silicon oxynitride. Additionally, the first protection layer 345 may be formed by a CVD process, a PECVD process, an ALD process, or an HDP-CVD process.

Figure 7E:
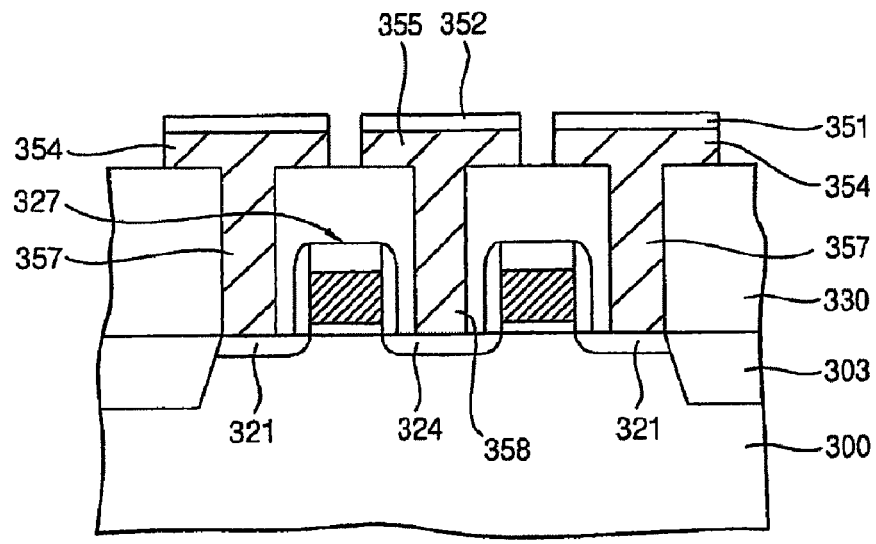

Referring to FIG. 7E, the photoresist film 348 is exposed and developed to form a photoresist pattern (not shown) on the first protection layer 345. Then a first protection layer pattern 351 and a lower wiring protection pattern 352 are simultaneously formed on the first conductive layer 342 by etching the first protection layer 345 using the photoresist pattern as an etching mask. The first protection layer pattern 351 is formed on one portion of the first conductive layer 342 under which the first contact region 321 is positioned. The lower wiring protection pattern 352 is formed on another portion of the first conductive layer 342 where the second contact region 324 is positioned.

After the photoresist pattern is removed by an ashing process and/or a stripping process, the first conductive layer 342 is partially etched by a dry etching process while the first protection layer pattern 351 and the lower wiring protection pattern 352 are used as etching masks. Hence, a pad 354 and the first contact 357 are formed together with a lower wiring 355 and a second contact 358. The first contact 357 makes contact with the first contact region 321, and the pad 354 is located on the first contact 357. The pad 354 is electrically connected to the first contact region 321 through the first contact 357. Further, the second contact 358 makes contact with the second contact region 324. The lower wiring 355 is electrically connected to the second contact region 324 through the second contact 358. That is, the pad 354 may be integrally formed with the first contact 357, and the lower wiring 355 may be integrally formed with the second contact 358. In an example embodiment of the present invention, the lower wiring 355 may include a bit line.

Figure 10:
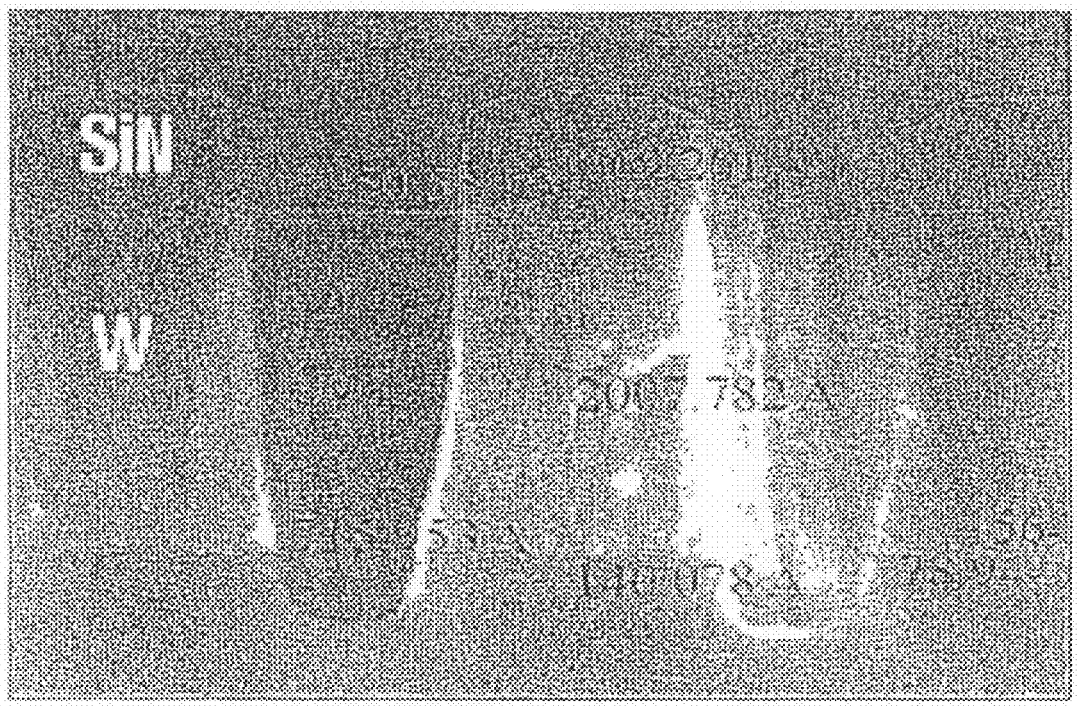
FIG. 10 is an electron microscopic picture showing cross sections of a first protection layer pattern, a pad, a lower wiring protection pattern and a lower wiring in FIG. 7E.

FIG. 10 is an electron microscopic picture illustrating cross-sections of the first protection layer pattern 351, the pad 354, the lower wiring protection pattern 352 and the lower wiring 355 in FIG. 7E. In FIG. 10, "SiN" represents the first protection layer pattern 351 and the lower wiring protection pattern 352 that include silicon nitride, and "W" represents the pad 354 and the lower wiring 355 that include tungsten. For example, each of the first protection layer pattern 351 and the lower wiring protection pattern 352 has a thickness of about 669.261 Å. Each of the pad 354 and the lower wiring 355 has a thickness of about 2,007.782 Å. Here, an interval between the pad 354 and the lower wiring 355 is about 715.953 Å, and an interval between the first protection layer pattern 351 and the lower wiring protection pattern 352 is about 1,050.584 Å.

Figure 7F:
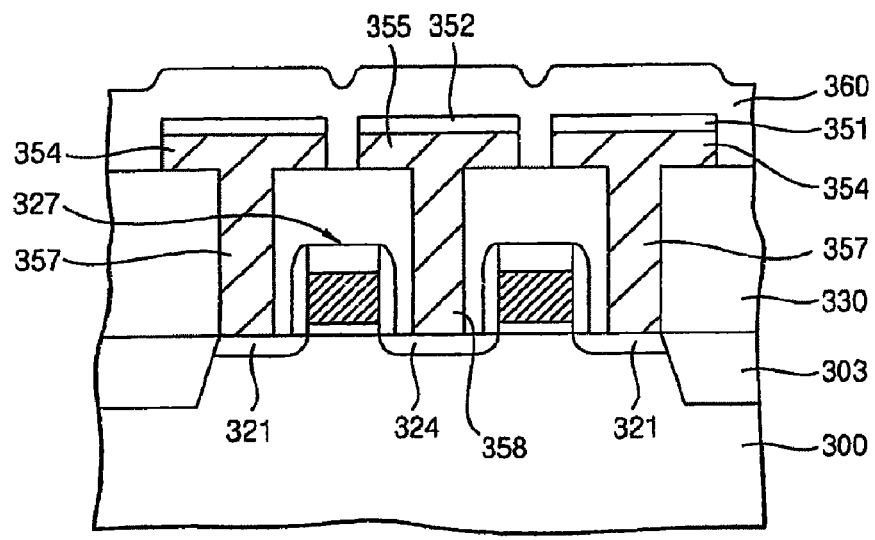

Referring to FIG. 7F, a second insulating interlayer 360 is formed on the first insulating interlayer 330 to cover the first protection layer pattern 351 and the lower wiring protection pattern 352. The second insulating interlayer 360 may be formed using an oxide by a CVD process, a PECVD process, an ALD process, or an HDP-CVD process. For example, the second insulating interlayer 360 may be formed using BPSG, PSG, USG, SOG, FOX, TEOS, PE-TEOS, or HDP-CVD oxide. In an example embodiment of the present invention, the second insulating interlayer 360 may be formed using the HDP-CVD oxide that may easily fill up a gap between the pad 354 and the lower wiring 355.

Figure 7G:
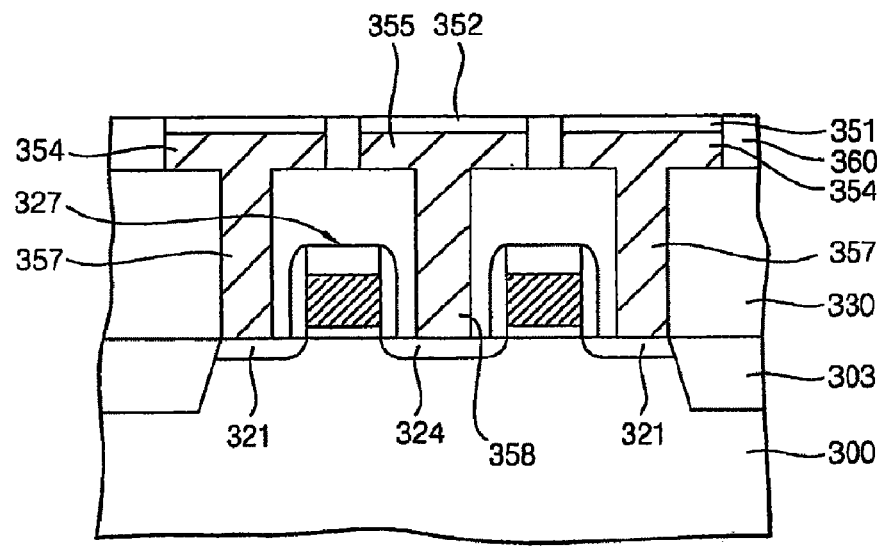

Referring to FIG. 7G, the second insulating interlayer 360 is partially removed by a CMP process until the first protection pattern 351 and the lower wiring protection pattern 352 are exposed. The second insulating interlayer 360 may be polished using a slurry including an abrasive that contains ceria having a relatively high etching selectivity between an oxide and a nitride. The first protection layer pattern 351 and the lower wiring protection pattern 352 may serve as polishing stop layers in the CMP process.

When the second insulating interlayer 360 is polished, the first protection layer pattern 351 and the pad 354 may be buried in the second insulating interlayer 360. Additionally, the lower wiring protection pattern 352 and the lower wiring 355 may also be buried in the second insulating interlayer 360.

In an example embodiment of the present invention, the second insulating interlayer 360 may be partially etched using an etching solution such as a Limulus Amoebocyte Lysate (LAL) solution so that the second insulating interlayer 360 may have a level surface.

Figure 7H:
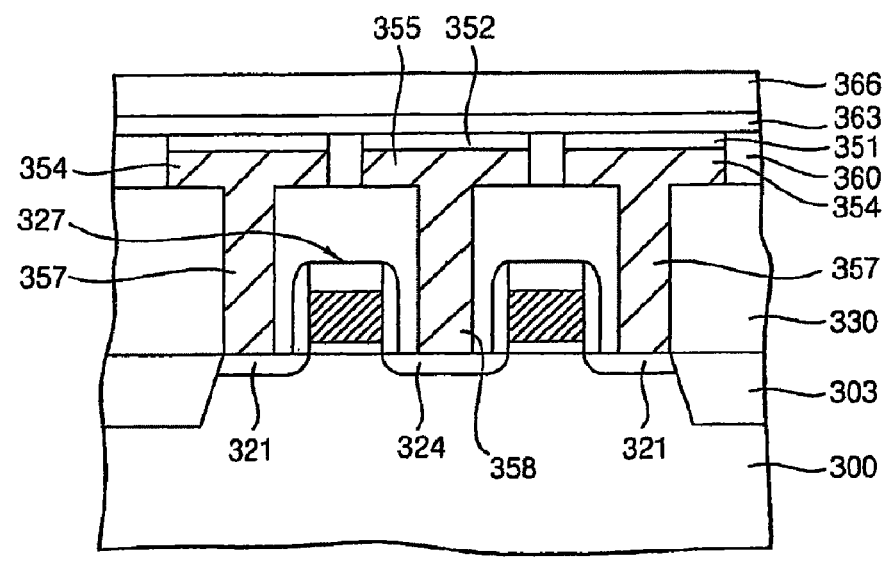

Referring to FIG. 7H, a second protection layer 363 is formed on the second insulating interlayer 360, the first protection layer pattern 351 and the lower wiring protection pattern 352. The second protection layer 363 may be formed using a nitride such as silicon nitride or an oxynitride such as silicon oxynitride. The second protection layer 363 may be formed by a CVD process, a PECVD process, an ALD process, or an HDP-CVD process.

A sacrificial layer 366 is formed on the second protection layer 363 using an oxide. For example, the sacrificial layer 366 may be formed using PE-TEOS, TEOS, USG, SOG, FOX, or HDP-CVD oxide. Further, the sacrificial layer 366 may be formed by a CVD process, a PECVD process, an ALD process, or an HDP-CVD process.

Figure 7I:
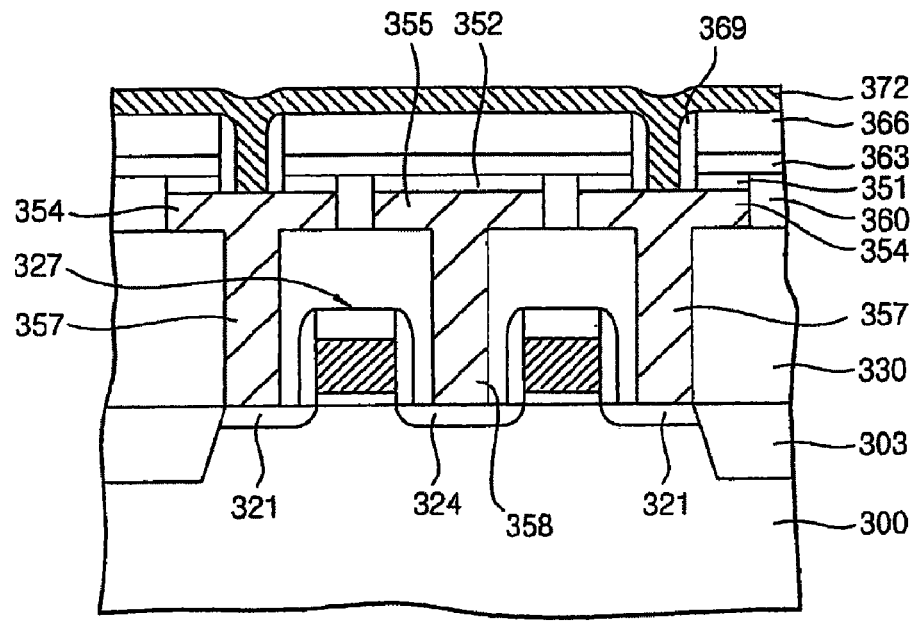

Referring to FIG. 7I, after a photoresist pattern (not shown) is formed on the sacrificial layer 366, the sacrificial layer 366, the second protection layer 363 and the first protection layer pattern 351 are partially etched using the photoresist pattern as an etching mask, thereby forming an opening that exposes the pad 354.

After forming a second insulation layer on the pad 354 and the sacrificial layer 366 to fill up the opening, the second insulation layer is partially etched by an anisotropic etching process to thereby form a preliminary spacer 369 on a sidewall of the opening. The preliminary spacer 369 may be formed using a nitride such as silicon nitride.

A second conductive layer 372 is formed on the pad 354 and the sacrificial layer 366 to fill up the opening. The second conductive layer 372 may be formed using polysilicon doped with impurities, a metal, or a metal nitride. For example, the second conductive layer 372 may be formed using tungsten, titanium, titanium nitride, tantalum, tantalum nitride, molybdenum nitride, niobium nitride, titanium silicon nitride, aluminum, titanium aluminum nitride, titanium boron nitride, zirconium aluminum nitride, molybdenum silicon nitride, molybdenum aluminum nitride, tantalum silicon nitride, or tantalum aluminum nitride. These can be used alone or in a mixture thereof. Further, the second conductive layer 372 may be formed by a CVD process, a PECVD process, an ALD process, an electron beam evaporation process, or a PLD process.

Figure 7J:
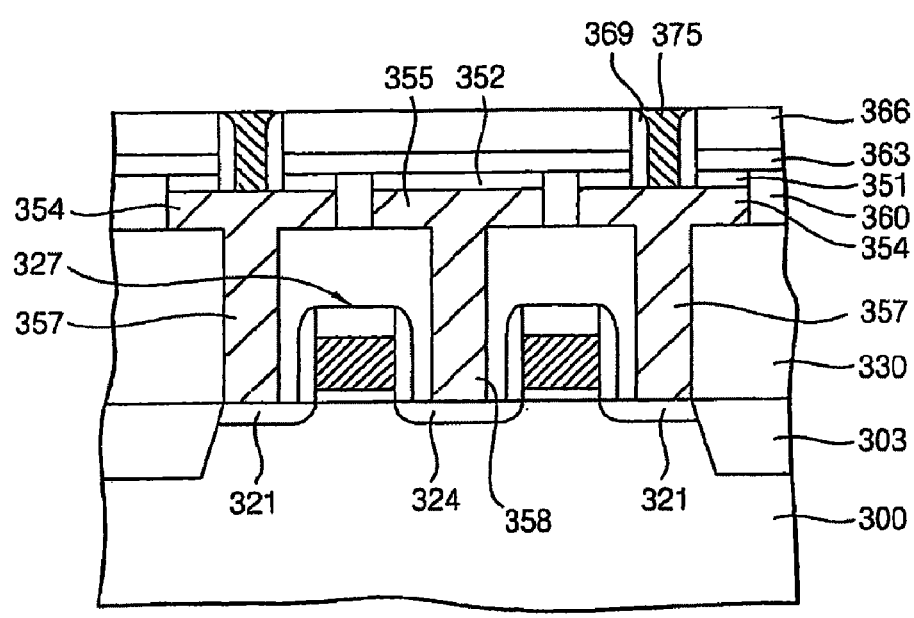

Referring to FIG. 7J, the second conductive layer 372 is partially removed by a CMP process until the sacrificial layer 366 is exposed to form a preliminary first electrode 375 in the opening. Here, the preliminary spacer 369 is positioned between a sidewall of the preliminary first electrode 375 and the sidewall of the opening. The preliminary first electrode 375 may be polished using a slurry that includes an abrasive containing ceria. In an example embodiment of the present invention, a surface of the preliminary first electrode 275 may be treated by an etching Process using an etching solution such as an LAL solution, so as to improve surface conditions of the preliminary first electrode 375.

Figure 7K:
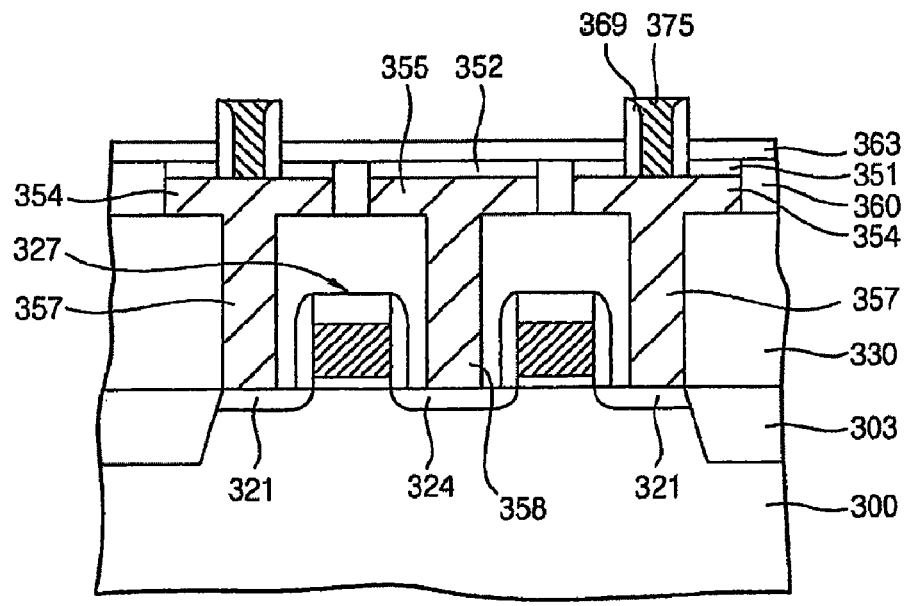

Referring to FIG. 7K, the sacrificial layer 366 may be removed by an etch-back process to expose the second protection layer 363 so that an upper portion of the preliminary first electrode 375 and the preliminary spacer 369 are exposed. The second protection layer 363 may serve as an etching stop layer. For example, when the sacrificial layer 366 is removed, the upper portions of the preliminary first electrode 375 and the preliminary spacer 369 may be protruded from the second protection layer 363 in pillar shapes.

Figure 7L:
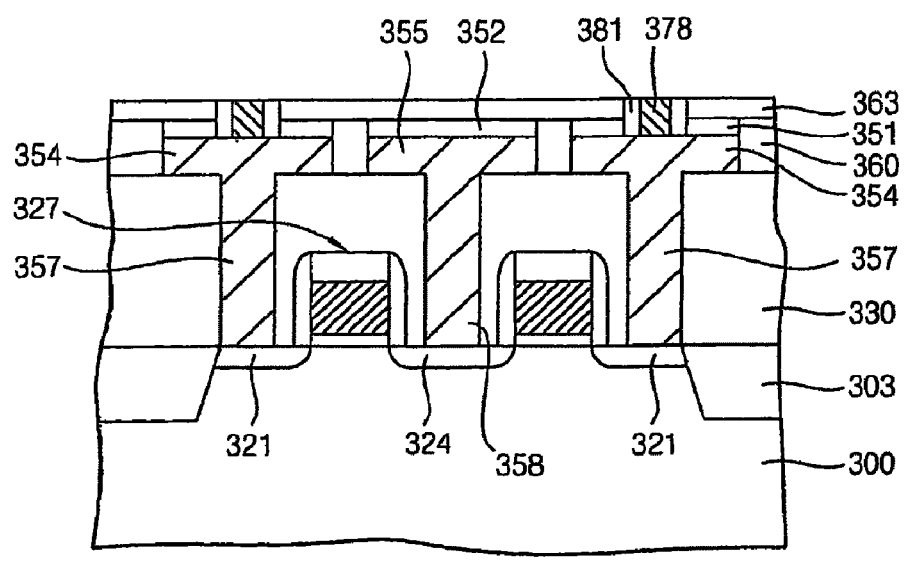

Referring to FIG. 7L, the upper portions of the preliminary first electrode 375 and the preliminary spacer protruded from the second protection layer 363 are removed by a CMP process so that a first electrode 378 and a spacer 381 are simultaneously formed on the pad 354.

The first electrode 378 and the spacer 381 are polished by a slurry that includes an abrasive containing ceria. Here, the second protection layer may serve as a polishing stop layer.

In an example embodiment of the present invention, when a CMP process is sufficiently carried out, the second protection layer 363 may be removed during formation of the first electrode 378 and the spacer 381.

Figure 7M:
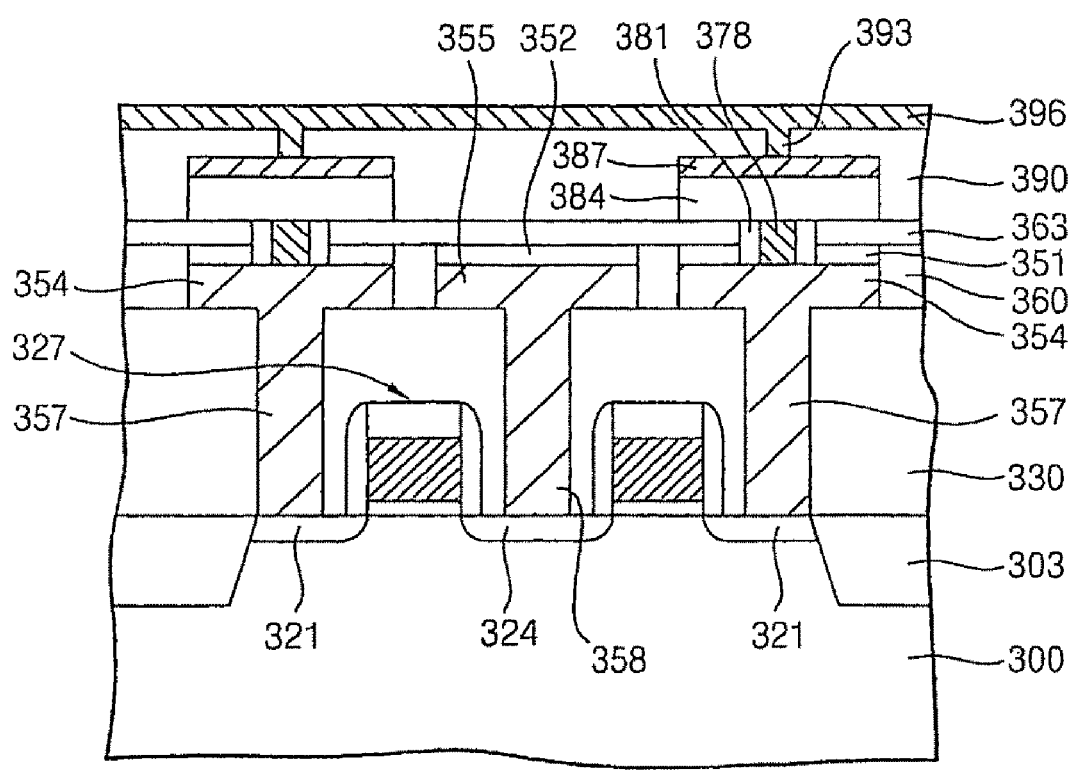

Referring to FIG. 7M, a phase-change layer pattern 384 and a second electrode 387 are sequentially formed on the second protection layer 363 and the first electrode 378. The phase-change material layer pattern 384 may be formed using a chalcogenide compound by a sputtering process, an ALD process, or a CVD process. The second electrode 387 may formed using doped polysilicon, a metal, or a conductive metal nitride. The second electrode 387 may be formed by a sputtering process, an ALD process, an electron beam evaporation process, a CVD process, or a PLD process.

A third insulating interlayer 390 is formed on the second protection layer 363 using an oxide to cover the phase-change layer pattern 384 and the second electrode 387. For example, the third insulating interlayer 390 may be formed using TEOS, PE-TEOS, BPSG, PSG, SOG, FOX, USG, or HDP-CVD oxide. The third insulating interlayer 390 may be formed by a CVD process, a PECVD process, an ALD process, or an HDP-CVD process.

After forming an upper contact hole (not shown) that exposes the second electrode 378 through the third insulating interlayer 390 using a photolithography process, an upper contact 393 that fills up the upper contact hole is formed on the second electrode 387 and an upper wiring 396 is simultaneously formed on the upper contact 393 and third insulating interlayer 390. The upper contact 393 and the upper wiring 396 may be formed using metal or conductive metal nitride. For example, the upper contact 393 and the upper wiring 396 may be formed using tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, molybdenum silicon nitride, molybdenum aluminum nitride, tantalum silicon nitride, or tantalum aluminum nitride. These can be used alone or in a mixture thereof.

FIGS. 11A to 11E are cross-sectional views illustrating a method of manufacturing a phase-change memory device in accordance with an example embodiment of the present invention.

Figure 11A:
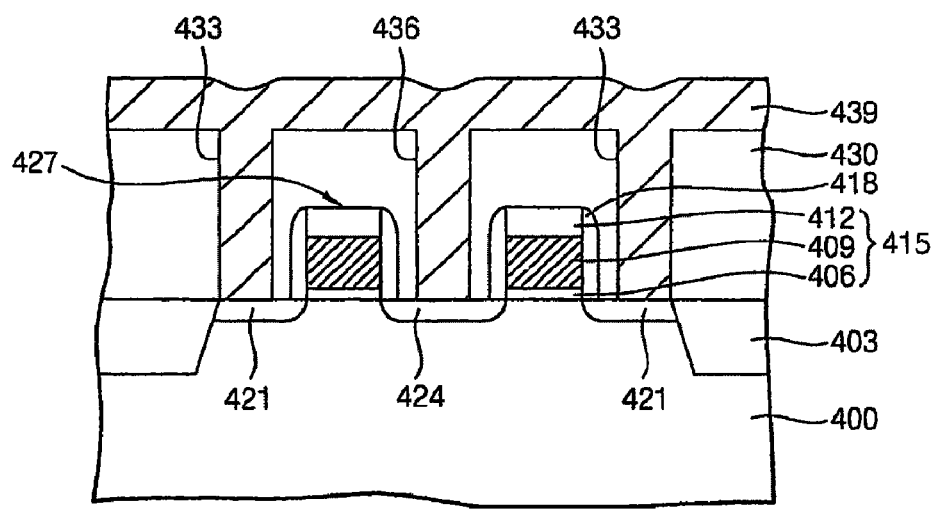
FIGS. 11A to 11E are cross-sectional views illustrating a method of manufacturing a phase-change memory device in accordance with an example embodiment of the present invention.

Referring to FIG. 11A, an isolation layer 403 is formed on the semiconductor substrate 400 to define an active region and a field region on the semiconductor substrate 400.

After a gate insulation layer, a gate conductive layer, and a gate mask layer are sequentially formed on the semiconductor substrate 400, the gate mask layer, the gate conductive layer and the gate insulation layer are partially etched. Hence, a gate structure 415 including a gate insulation layer pattern 406, a gate electrode 409, and a gate mask pattern 412 is formed on the semiconductor substrate 400. The gate electrode 409 may have a single layer structure of a doped polysilicon layer or a metal layer, or a multi layer structure that includes a doped polysilicon layer, a metal layer and/or a conductive metal nitride layer. The gate mask pattern 412 may be formed using a material that has an etching selectivity relative to the gate electrode 409 and the gate insulation layer pattern 406.

After a first insulation layer is formed on the semiconductor substrate 400 to cover the gate mask pattern 412, the first insulation layer is anisotropically etched to form a gate spacer 418 on a sidewall of a gate structure 415.

A first contact region 421 and a second contact region 424 are formed at portions of the semiconductor substrate 400 exposed between the gate structures 415 by an ion implantation process using the gate structures 415 as ion implantation masks. Thus, transistors 427 including the gate structures 415, the first contact region 421, and the second contact region 424 are formed on the semiconductor substrate 400.

A first insulating interlayer 430 is formed on the semiconductor substrate 400 to cover the transistors 427. The first insulating interlayer 430 may be formed using an oxide by a CVD process, a PECVD process, an ALD process, or an HDP-CVD process. The first insulating interlayer 430 is partially etched by a photolithography process so that first and second contact holes 433 and 436 that expose the first and second contact region 421 and 424 are formed through the first insulating interlayer 430.

A preliminary first conductive layer 439 is formed on the first insulating interlayer 430 to fill up the first and second contact holes 433 and 436. The preliminary first conductive layer 439 may be formed using polysilicon doped with impurities, a metal, or a conductive metal nitride. The preliminary first conductive layer 439 may be formed by a sputtering process, a CVD process, a PECVD process, an ALD process, an electron beam evaporation process, or a PLD process.

Figure 11B:
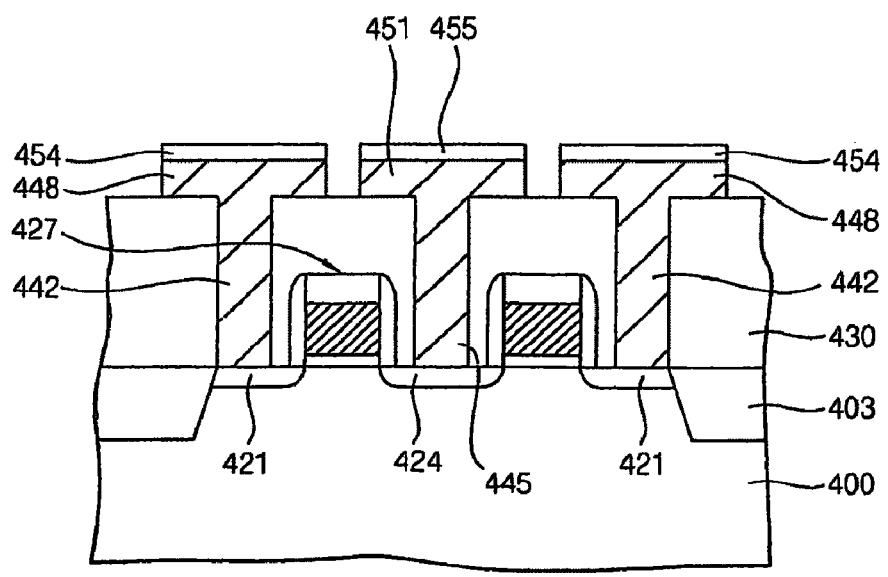

Referring to FIG. 11B, a surface of the preliminary first conductive layer 439 is treated by a CMP process to remove a stepped portion generated at an upper portion of the preliminary first conductive layer 439, thereby improving a surface roughness of the preliminary first conductive layer 439. Thus, a first conductive layer (not shown) having an improved surface without a stepped portion is formed on the first insulating interlayer 430.

A first protection layer (not shown) and a photoresist pattern (not shown) are sequentially formed on the first conductive layer. The first protection layer may be formed using a nitride or an oxynitride by a CVD process, a PECVD process, an ALD process, or an HDP-CVD.

The first protection layer may be patterned using the photoresist pattern as an etching mask so that a first protection layer pattern 454 and a lower wiring protection pattern 455 are simultaneously formed on the first conductive layer. The first protection layer pattern 454 is formed on one portion of the first conductive layer under which the first contact region 421 is positioned. The lower wiring protection pattern 455 is formed on another portion of the first conductive layer where the second contact region 424 is positioned.

After removing the photoresist pattern, the first conductive layer is partially etched by a dry etching process using the first protection layer pattern 454 and the lower wiring protection pattern 455 as etching masks. Thus, a first electrode 448, a first contact 442, a lower wiring 451 and a second contact 445 are simultaneously formed. The first contact 442 makes contact with the first contact region 421. The first electrode 448 is positioned on the first contact 442 so that the first electrode 448 is electrically connected to the first contact region 421 through the first contact 442. Further, the second contact 445 makes contact with the second contact region 424. The lower wiring 451 such as a bit line is electrically connected to the second contact region 424 through the second contact 445. The first electrode 448 may be integrally formed with the first contact 442 and the lower wiring 451 may be also integrally formed with the second contact 445.

Figure 11C:
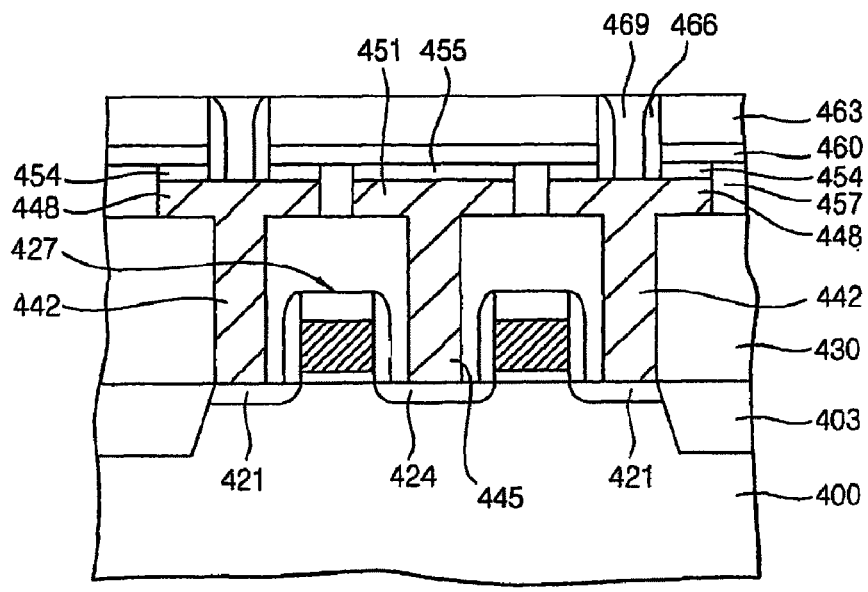

Referring to FIG. 11C, a second insulating interlayer 457 is formed on the first insulating interlayer 430 to cover the first protection layer pattern 454 and the lower wiring protection pattern 455. The second insulating interlayer 457 may be formed by a CVD process, a PECVD process, an ALD process, or an HDP-CVD process.

The second insulating interlayer 457 is partially removed by a CMP process until the first protection layer pattern 454 and the lower wiring protection pattern 455 are exposed. The second insulating interlayer 457 may be polished using a slurry that includes an abrasive containing ceria that has a relatively high etching selectivity between an oxide and a nitride. The first protection layer pattern 454 and the lower wiring protection pattern 455 may serve as polish stop layers. In an example embodiment of the present invention, the second insulating interlayer 457 is partially etched using an etching solution such as an LAL solution so that the second insulating interlayer 457 may have a level surface.

A second protection layer 460 is formed on the second insulating interlayer 457, the first protection layer pattern 454 and the lower wiring protection pattern 455. The second protection layer 460 may be formed using a nitride or oxynitride by a CVD process, a PECVD process, an ALD process, or an HDP-CVD process.

A sacrificial layer 463 is formed on the second protection layer 460 using an oxide. The sacrificial layer 463 may be formed by a CVD process, a PECVD process, an ALD process, or an HDP-CVD process.

The sacrificial layer 463, the second protection layer 460 and the first protection layer pattern 454 are partially etched by a photolithography process, thereby forming an opening that exposes the first electrode 448.

After a second insulation layer is formed on the first electrode 448 and the sacrificial layer 463 to fill up the opening, the second insulation layer is anisotropically etched so that a preliminary spacer 466 is formed on a sidewall of the opening.

A phase-change material layer (not shown) is formed on the first electrode 448 and the sacrificial layer 463 to fill up the opening. The phase-change material layer may be formed using a chalcogenide compound by a CVD process, an ALD process, or a sputtering process.

The phase-change material layer is partially removed by a CMP process until the sacrificial layer 463 is exposed, thereby forming a preliminary phase-change material layer pattern 469 to fill up the opening. Here, the preliminary spacer 466 is positioned between a sidewall of the preliminary phase-change material layer pattern 469 and the sidewall of the opening.

Figure 11D:
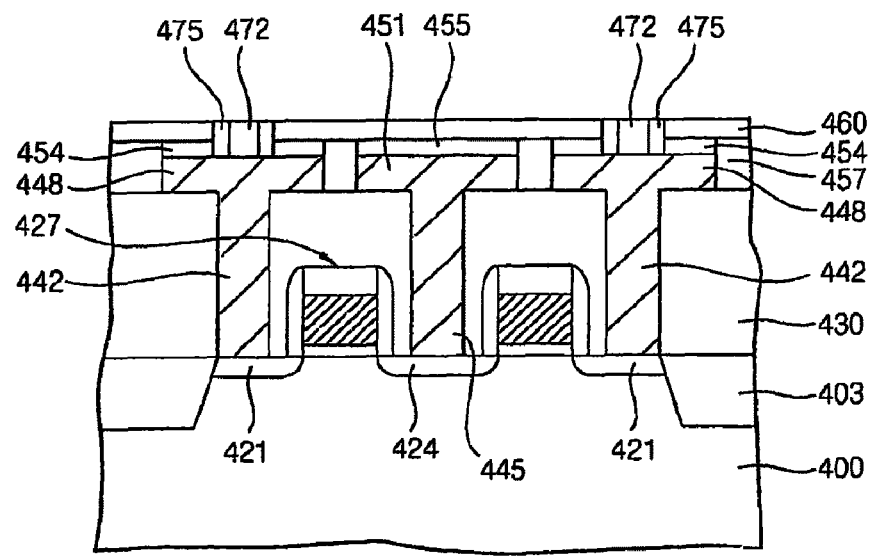

Referring to FIG. 11D, the sacrificial layer 463 is removed by an etch-back process to expose the second protection layer 460 so that upper portions of the preliminary phase-change material layer pattern 469 and the preliminary spacer 466 are upwardly protruded.

The protruding upper portions of the preliminary phase-change material layer pattern 469 and the preliminary spacer 466 are removed by a CMP process so that a phase-change material layer pattern 472 and a spacer 475 are simultaneously formed on the first electrode 448. The phase-change material layer pattern 472 and the spacer 475 may be formed using a slurry that includes an abrasive containing ceria. The second protection layer 460 may serve as a polishing stop layer. However, when the CMP process is carried out, the second protection layer 460 may be completely removed during formation of the phase-change material layer pattern 472 and the spacer 475.

Figure 11E:
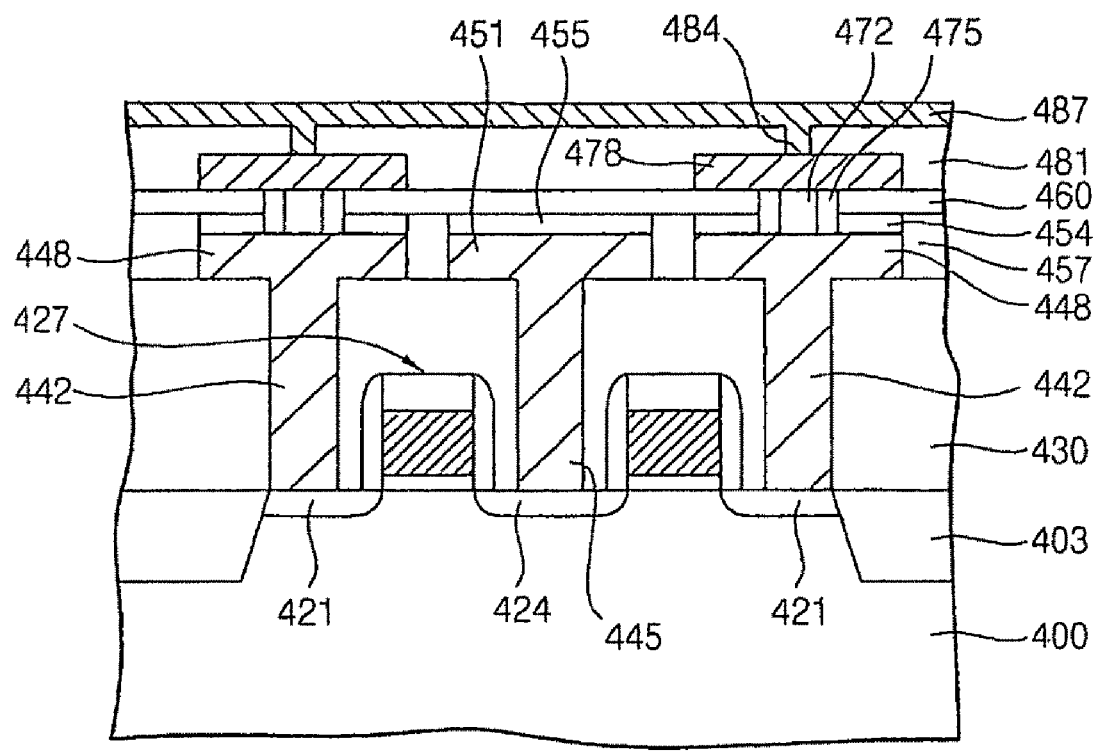

Referring to FIG. 11E, a second electrode 478 is formed on the second protection layer 460 and the phase-change material layer pattern 472. The second electrode 478 may be formed using a doped polysilicon, a metal, or a conductive metal nitride. The second electrode 478 may be formed by a sputtering process, an ALD process, an electron beam evaporation process, a CVD process, or a PLD process.

A third insulating interlayer 481 is formed on the second protection layer 460 to cover the second electrode 478. The third insulating interlayer 481 may be formed using an oxide by a PECVD process, an ALD process, or an HDP-CVD process. After an upper contact hole (not shown) that exposes the second electrode 478 is formed through the third insulating interlayer 481, an upper contact 484 filling up the upper contact hole is formed on the second electrode 478 and an upper wiring 487 is formed on the upper contact 484 and the third insulating interlayer 481. The upper contact 484 may be integrally formed with the upper wiring 487 using metal or conductive metal nitride.

According to the present invention, since a pad or a first electrode may be formed by a dry etching process, generation of a seam or a void due to a CMP process in the pad or the first electrode may be suppressed. Thus, a resistance defect between the pad and the first electrode or the first electrode and a phase-change material layer pattern may be efficiently prevented. As a result, electrical characteristics of a variable resistance structure having the pad and the first electrode may be improved. Further, a contact and the pad or the contact and the first electrode may be simultaneously formed so that a manufacturing process of the phase-change memory device may be simplified, and also, manufacturing costs and time of the phase-change memory device may be reduced. Furthermore, since a first protection layer pattern and a second protection layer may enclose and support the first electrode and the phase-change material layer, the structural reliability of the variable resistance structure may be considerably enhanced.

The present invention may be practiced in many ways. What follows are exemplary, non-limiting descriptions of some embodiments of the present invention.

According to some aspects of the present invention, there is provided a method of manufacturing a variable resistance structure. In the method of manufacturing the variable resistance structure, after a first insulation layer is formed on a substrate having a contact region, a contact hole exposing the contact region is formed through the first insulation layer. A first conductive layer is formed on the first insulation layer to fill up the contact hole, and then a first protection layer pattern is formed on the first conductive layer. The first conductive layer is partially etched to simultaneously form a contact making contact with the contact region and a pad on the contact. A second protection layer is formed on the first protection layer pattern. An opening exposing the pad is formed through the second protection layer and the first protection layer pattern. After a first electrode is formed on the pad to fill up the opening, a phase-change material layer pattern and a second electrode are sequentially formed on the first electrode and the second protection layer.

In an example embodiment of the present invention, a surface of the first conductive layer may be treated by a chemical mechanical polishing (CMP) process.

In an example embodiment of the present invention, the first conductive layer may be etched by a dry etching process to form the contact and the pad.

In an example embodiment of the present invention, before forming the second protection layer, a second insulating interlayer enclosing the first protection layer pattern and the pad may be formed on the second protection layer. For example, the first insulation layer and the second insulation layer may be formed using oxide. Additionally, the first protection layer pattern and the second protection layer may be formed using nitride or oxynitride.

In an example embodiment of the present invention, a sacrificial layer may be formed on the second protection layer. Here, the opening may be formed from the sacrificial layer to the first protection layer pattern. For example, the sacrificial layer may be formed using oxide.

In an example embodiment of the present invention, a spacer may be formed on a sidewall of the opening.

In an example embodiment of the present invention, after forming a second conductive layer on the sacrificial layer to fill up the opening, the second conductive layer may be partially removed to form a preliminary first electrode in the opening. For example, the preliminary first electrode may be formed by a CMP process.

In an example embodiment of the present invention, after removing the sacrificial layer so that the preliminary first electrode protrudes from an upper portion of the second protection layer, a protruding portion of the preliminary first electrode may be removed to form the first electrode. For example, the first electrode may be formed by a CMP process. The sacrificial layer may be removed by an etch-back process.

According to another aspect of the present invention, there is provided a method of manufacturing a variable resistance structure. In the method of manufacturing the variable resistance structure, after forming a first insulation layer on the substrate having a contact region, a contact hole exposing the contact region is formed through the first insulation layer. A first conductive layer is formed on the first insulation layer to fill up the contact hole, and a first protection layer pattern is formed on the first conductive layer. The first conductive layer is partially etched to simultaneously form a contact making contact with the contact region and a first electrode on the contact. A second protection layer is formed on the first protection layer pattern. After forming an opening exposing the first electrode through the second protection layer and the first protection layer pattern, a phase-change material layer pattern is formed on the first electrode to fill up the opening. A second electrode is formed on the phase-change material layer pattern and the second protection layer.

In an example embodiment of the present invention, the contact and the first electrode may be formed by dry etching processes.

In an example embodiment of the present invention, a second insulation layer may be formed to cover the first protection layer pattern and the first electrode before forming the second protection layer.

In an example embodiment of the present invention, a sacrificial layer may be formed on the second protection layer. Here, the opening may be formed from the sacrificial layer to the first protection layer pattern.

In an example embodiment of the present invention, a spacer may be formed on a sidewall of the opening.

In an example embodiment of the present invention, after forming a phase-change material layer on the sacrificial layer to fill up the opening, the phase-change material layer may be partially removed to form a preliminary phase-change material pattern buried in the opening. For example, the preliminary phase-change material layer pattern may be formed by a CMP process.

In an example embodiment of the present invention, after removing the sacrificial layer so that the preliminary phase-change material layer pattern protrudes from an upper portion of the second protection layer, a protruding portion of the preliminary phase-change layer pattern may be removed to form the phase-change material layer pattern. The phase-change material layer pattern may be formed by a CMP process. The sacrificial layer may be removed by an etch-back process.

According to still another aspect of the present invention, there is provided a method of manufacturing a phase-change memory device. In the method of manufacturing the phase-change memory device, a first contact region and a second contact region are formed on a semiconductor substrate, and then a first insulating interlayer is formed on the semiconductor substrate. After forming a first contact hole and a second contact hole exposing the first and the second contact regions through the first insulating interlayer, a first conductive layer is formed on the first insulating interlayer to fill up the first and the second contact holes. A first protection layer pattern and a lower wiring protection pattern are formed on the first conductive layer. The first conductive layer is partially etched to form a first contact, a second contact, a pad and a lower wiring. The first and the second contacts make contact with the first and the second contact regions. The pad and the lower wiring are formed on the first and the second contacts, respectively. After forming a second protection layer on the first protection layer pattern and the lower wiring protection pattern, an opening exposing the pad is formed through the second protection layer and the first protection layer pattern. A first electrode is formed on the pad to fill up the opening. A phase-change material layer pattern is formed on the first electrode and the second protection layer, and then a second electrode is formed on the phase-change material layer pattern.

In an example embodiment of the present invention, after forming a preliminary first conductive layer on the first insulating interlayer to fill up the first and the second contact holes, a surface of the preliminary conductive layer may be polished by a CMP process to form the first conductive layer.

According to still another aspect of the present invention, there is provided a method of manufacturing a phase-change memory device. In the method of manufacturing the phase-change memory device, after forming a first contact region and a second contact region on the semiconductor substrate, a first insulating interlayer is formed on the semiconductor substrate. A first contact hole and a second contact hole are formed through the first insulating interlayer to expose the first and the second contact regions. A first conductive layer is formed on the first insulating interlayer to fill up the first and the second contact holes. A first protection layer pattern and a lower wiring protection pattern are formed on the first conductive layer. The first conductive layer is partially etched to form a first contact, a second contact, a first electrode and a lower wiring. The first and the second contact make contact with the first and the second contact regions. The first electrode and the lower wiring are positioned on the first and the second contacts. After forming a second protection layer on the first protection layer pattern and the lower wiring protection pattern, an opening exposing the first electrode is formed through the second protection layer and the first protection layer pattern. A phase-change material layer pattern is formed on the first electrode to fill up the opening, and then a second electrode is formed on the phase-change material layer pattern and the second protection layer.

According to the present invention, since a pad or a first electrode may be formed by a dry etching process, a generation of a seam or a void due to a CMP process may be suppressed in the pad or the first electrode. Thus, a resistance defect between the pad and the first electrode or the first electrode and a phase-change material layer pattern may be prevented, thereby improving electrical characteristics of a variable resistance structure including the pad and the first electrode. Further, a contact and the pad or the contact and the first electrode may be simultaneously formed so that a manufacturing process of the phase-change memory device may be simplified, and also, manufacturing costs and time may be reduced.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

The invention claimed is:

1. A phase-change memory device comprising:
a first contact region and a second contact region on a semiconductor substrate;
a first insulating interlayer on the semiconductor substrate;
a first contact hole and a second contact hole disposed in the first insulating interlayer so as to expose the first and second contact regions;
a first contact and a second contact, wherein the first and the second contacts fill the first contact hole and the second contact hole, respectively, and are disposed so as to connect to the first and second contact regions;
a first electrode and a lower wiring, wherein the first electrode and the lower wiring are in contact with the first and second contacts, respectively, and on the first insulating interlayer;
a first protection layer pattern and a lower wiring protection pattern in contact with the first electrode and the lower wiring, respectively, the first protection layer pattern and the lower wiring protection pattern being separate from the first electrode and the lower wiring, respectively;
a second protection layer in contact with the first protection layer pattern and the lower wiring protection pattern;
a second electrode in contact with the second protection layer; and
a via filled with a phase-change material disposed between the first electrode and the second electrode,
wherein the first contact and the first electrode are integrally formed, and the second contact and the lower wiring are integrally formed.

2. The device of claim 1, wherein the substrate comprises a silicon wafer, a silicon-on-insulator substrate or a single-crystalline metal-oxide substrate.

3. The device of claim 1, wherein the first insulating layer comprises phosphor silicate glass, boro-phosphor silicate glass, undoped silicate glass, spin-on-glass, tetraethyl orthosilicate (TEOS), plasma-enhanced TEOS, flowable oxide, high-density plasma chemical vapor deposition oxide, or silicon nitride.

4. The device of claim 1, further comprising a lower structure including a plurality of transistors disposed on the semiconductor substrate.

5. The device of claim 4, wherein the first insulation layer has a sufficient thickness to substantially completely cover the lower structure.

6. The device of claim 1, wherein the second electrode comprises polysilicon doped with impurities, a metal, or a conductive metal nitride.

7. The device of claim 1, wherein the first protection layer pattern comprises nitride or oxynitride.

8. The device of claim 1, wherein the phase-change material comprises a chalcogenide compound.

9. The device of claim 1, further comprising a second insulating layer surrounded by the first protection layer pattern and the second protection layer.

10. The device of claim 9, wherein the second insulating layer comprises phosphor silicate glass, boro-phosphor silicate glass, undoped silicate glass, spin-on-glass, tetraethyl orthosilicate (TEOS), plasma-enhanced TEOS, flowable oxide, or high-density plasma chemical vapor deposition oxide.

11. The device of claim 1, further comprising a spacer disposed between the first protection layer pattern and the phase-change material.

* * * * *